United States Patent
Okabe et al.

(10) Patent No.: US 12,003,235 B2
(45) Date of Patent: Jun. 4, 2024

(54) TACTILE SENSOR FORMED ON POLYIMIDE THIN FILM HAVING HIGH TOTAL LIGHT TRANSMITTANCE, AND SWITCHING DEVICE USING SAME

(71) Applicant: MITSUI CHEMICALS, INC., Tokyo (JP)

(72) Inventors: Jun Okabe, Tokyo (JP); Tadahiro Sunaga, Yamato (JP); Shizuo Tokito, Yonezawa (JP); Tomohito Sekine, Yamagata (JP)

(73) Assignee: MITSUI CHEMICALS, INC., Tokyo (JP)

( * ) Notice: Subject to any disclaimer, the term of this patent is extended or adjusted under 35 U.S.C. 154(b) by 443 days.

(21) Appl. No.: 17/613,647

(22) PCT Filed: Jun. 15, 2020

(86) PCT No.: PCT/JP2020/023394
§ 371 (c)(1),
(2) Date: Nov. 23, 2021

(87) PCT Pub. No.: WO2020/255920
PCT Pub. Date: Dec. 24, 2020

(65) Prior Publication Data
US 2022/0239296 A1 Jul. 28, 2022

(30) Foreign Application Priority Data
Jun. 19, 2019 (JP) .................................. 2019-113906

(51) Int. Cl.
*H01L 41/113* (2006.01)
*C08G 73/10* (2006.01)
(Continued)

(52) U.S. Cl.
CPC ....... *H03K 17/964* (2013.01); *C08G 73/1082* (2013.01); *H10N 30/302* (2023.02); *H10N 30/857* (2023.02)

(58) Field of Classification Search
None
See application file for complete search history.

(56) References Cited

U.S. PATENT DOCUMENTS

| 2011/0217519 A1 | 9/2011 | Sakashita |
| 2014/0060210 A1 | 3/2014 | Jeon et al. |

(Continued)

FOREIGN PATENT DOCUMENTS

| JP | 4965274 B2 | 7/2012 |
| JP | 2013178241 A | 9/2013 |

(Continued)

OTHER PUBLICATIONS

Anonymous, "ECRIOS (TM) Adopted as Substrate for Ultrathin Organic Solar Battery", May 31, 2018, Retrieved from the Internet: URL:https://jp.mitsuichemicals.com/sited/default/files/media/document/2018/180531e.pdf. (2 pages).

(Continued)

*Primary Examiner* — Jack S Chen
(74) *Attorney, Agent, or Firm* — BUCHANAN, INGERSOLL & ROONEY PC

(57) ABSTRACT

A light, flexible, and tough thin film having high total light transmittance that can be formed on various three dimensional shapes, and also provides a stably driven tactile sensor, which is an electronic device having the switching function thereof, is provided. The tactile sensor is formed on a polyimide thin film having high total light transmittance, thermal resistance, and a polar component of surface free energy with a specific value, and has a switching device that emits a voltage signal which, through an electronic circuit (Continued)

for controlling noise, stably drives another device. This tactile sensor has a curved or flat surface and has a first electrode, a ferroelectric layer, and a second electrode formed over the polyimide thin film. The switching device as a tactile sensor can drive another device merely by a light touch with a finger, and can be manufactured at a high non-defective rate.

14 Claims, 6 Drawing Sheets

(51) Int. Cl.
*H03K 17/96* (2006.01)
*H10N 30/30* (2023.01)
*H10N 30/857* (2023.01)

(56) References Cited

U.S. PATENT DOCUMENTS

| | | |
|---|---|---|
| 2014/0191221 A1 | 7/2014 | Benwadih et al. |
| 2016/0239121 A1 | 8/2016 | Murakami et al. |
| 2019/0030732 A1 | 1/2019 | Kondoh et al. |
| 2020/0176146 A1 | 6/2020 | Taga |
| 2022/0239296 A1* | 7/2022 | Okabe ............... C08G 73/1082 |

FOREIGN PATENT DOCUMENTS

| | | |
|---|---|---|
| JP | 6008970 B2 | 10/2016 |
| JP | 6259390 B2 | 1/2018 |
| JP | 6369919 B2 | 8/2018 |
| JP | 2018136954 A | 8/2018 |
| JP | 6447492 B2 | 1/2019 |
| JP | 6471812 B2 | 2/2019 |
| JP | 6517058 B2 | 5/2019 |
| WO | 2015045325 A1 | 4/2015 |
| WO | 2019039209 A1 | 2/2019 |

OTHER PUBLICATIONS

Xu et al., "Thermally Stable, Highly Efficient, Ultraflexible Organic Photovoltaics", Proceedings of the National Academy of Sciences, May 1, 2018, vol. 115, No. 18, pp. 4589-4594.

Yang et al., "A Noise-Immune High-Speed Readout Circuit for In-Cell Touch Screen Panels", IEEE Transactions on Circuits and Systems I: Regular Papers, Jul. 1, 2013, vol. 60, No. 7, pp. 1800-1809.

Yuka, "ECRIOS Transparent Polyimide Film", May 23, 2018, Retrieved from the Internet: URL://https://jp.mitsuichemicals.com/sites/default/files/media/document/2018/180523_data13.pdf. (1 page).

Extended European Search Report issued Jun. 20, 2023, by the European Patent Office in corresponding European Patent Application No. 20827660.0. (8 pages).

* cited by examiner

V<sub>DD</sub> Drive voltage of operational amplifier (3V)

R2 Resistor (1.8 MΩ)    R3 Resistor (430 kΩ)

C2 Capacitor (0.033 μF)   C3 Capacitor (0.01 μF)

U2 Operational amplifier

A Tactile sensor   B Operational amplifier   C Comparator
D Toggle flip-flop made from delay flip-flop
E LED light or oscillator   Vcc Drive voltage of operational amplifier   Vref Reference voltage
R1 Resistor (0.71 MΩ)   R2 Resistor (110 kΩ)   R3 Resistor (10 Ω)

A Tactile sensor  B Operational amplifier
D Toggle flip-flop made from delay flip-flop
E LED light or oscillator   Vcc Drive voltage of operational amplifier
R1 Resistor (0.71 MΩ)   R2 Resistor (110 kΩ)   R3 Resistor (10 Ω)

TACTILE SENSOR FORMED ON POLYIMIDE THIN FILM HAVING HIGH TOTAL LIGHT TRANSMITTANCE, AND SWITCHING DEVICE USING SAME

TECHNICAL FIELD

The present invention relates to a tactile sensor formed on a polyimide thin film having high total light transmittance, and a switching device using the sensor.

BACKGROUND ART

In recent years, in the field of development of electronic devices, printed electronics which are technology to fabricate an electronic device by use of printing methods have been attracting much attention. The printed electronics are consisting of two main technological elements. The first is a wiring technology using a metal particle ink or a metal paste which have been energetically developed recently, and this is expected to contribute to both simplification of the device production process and lowering the production cost which cannot be achieved by a conventional lithography process. The second is qualification of the device due to a polymer film having characteristics such as thinness, flexibility, and stretchability, replacing a printed circuit board. Wiring of the metal materials on the polymer film is influenced by each of their surface properties since their surface is contacted with each other.

To explain further, according to well-known Young's formula, wiring states are determined by each of the surface energies of both a liquid metal material and a solid polymer film. Since those surface energies are influenced by each chemical composites that hold dispersion and polarity in the molecules, materials for the printed electronics should be understood from a point of view of their surface free energies.

The target markets of the printed electronics are such as trillion sensors, printed devices, lasers, images, organic electroluminesence, organic transistors and the like. These technologies are expected to contribute to so called Society 5.0 aiming for 2020 to 2030. They would play significant roles facing to the future society subjects like population decrease, aging, energy, global environment, disasters, spread of discriminatory, and so on.

The society which will arise as a result of the Fourth Industrial Revolution will be a form that everything is connected to the Internet and information on everything will be accumulated to a Big Data and valuable feedback will be provided to people in the society. Lap-top computers, smart phones, tablets, TVs have currently been connected to the Internet, the connection will be broaden to transportations (vehicles, trains, aircrafts, ships, trucks), home appliances (refrigerators, air conditioners, vaccum cleaners, and security systems), medical facilities (hospital beds and healthcare monitors) and the like. For example, traffic congestion will be able to be predicted due to each automobiles' positions, automatic driving will be advanced, and healthcare monitoring by some devices will mitigate nursing in medical facilities which has been performed by doctors and nurses.

Although formally described societies are currently aimed, it is not enough for the social components to be just connected to the Internet. Changes of the components' forms and shapes should be considered. In case of automobiles, smooth shapes and curvaceously have been advanced by use of Aluminum and resin materials. In fact, according to the Japan Automobile Manufacturers Association's survey of raw material composition ratio for automobile production, automobiles in 1980s were used only 3% of Aluminum and 6 to 7% of resin materials, and mainly 73 to 75% steel was embedded. Because of this ratio, the automobiles held angular shapes and gave heavy impressions to people. After 2000, ratio of aluminum increased to 6% and that of resin materials also increased to 8%, instead of decrease of steel. This change has also contributed to weight reductions and improvement of fuel consumptions. Similar changes can be seen in home appliances. Since an individual preference is now more important for home appliances' designs and compatibilities, curved shapes of refrigerators, TVs, air conditioners, vacuum cleaners, and the like that gives soft impression to persons are widely incorporated. Compatibility to curved shapes is also essential for collecting vital information by a healthcare devices that are worn by patients in hospitals. Therefore, we should understand things in IoT societies have various curved surface.

It should be also argued that robots which have been mainly acted in factories are now developing to be communication robots. The robots will be also connected to the Internet and will play significant roles in the IoT societies. Because the communication robots are close to humans, those should be friendly to us so as to make fine relationship with us. Thus, it is not too much to say that robots having smooth curved surfaces and suitable balance between hardness and softness will be our friendly neighbors in our lives after we feel the robots by our sight and tactics.

As formally described, future vehicles, home appliances, healthcare devices, and robots would have more curved shapes, and lots of sensors that will be attached to those things for collecting information such as positions, temperature, humidity, illuminance and pressure in IoT societies. Therefore, not only development of modules in those things, but printing machines, materials and substrates for wiring on a curved or uneven surface in the field of printed electronics become more important.

It should be also noted that lots of electronic devices in IoT societies are needed to be provided at low cost. It is thought less than ¥500 per device will be necessary.

As explained before, printed electronics are different from lithography process in that it is a wiring technology by printing metal particle inks and pastes, however, the printed electronics can be hybridized with integrated circuit (IC) chips which are produced by the lithography process to achieve high functionality and to produce flexible devices economically. After this method was first proposed in the United States, it is expected to be brand new application by the product having characteristics such as low cost, high functionality, right-weight, thinness, flexibility, and toughness.

Polymer films for the printed electronics are such as polyethylene terephthalate (hereinafter referred to as PET), polyethylene naphthalate (hereinafter referred to as PEN), polyether ether ketone (hereinafter referred to as PEEK), polyphenylene sulfide (hereinafter referred to as PPS), polyarylate (hereinafter referred to as PAR), polyimide (hereinafter referred to as PI), polycarbonate (hereinafter referred to as PC), cellulose triacetate (hereinafter referred to as TAC), cellulose acetate propionate (hereinafter referred to as CAP) (see patent Literature (hereinafter referred to as PTL) 1). Use of these polymer films enable devices to be right-weight and thinness.

Additionally, healthcare devices for monitoring human health conditions on skins, clothes and beds is attracting attention because of population decrease and aging. As an example, PTL 2 discloses a device in beds or floors which holds a vibration sensor to detect actions of a lung and a heart, monitoring human health for 24 h. As a result of use of the invented device, nursing for patients and senior persons in beds would be mitigated. The vibration sensor utilizes polyvinylidene fluoride to detect the actions of a lung and a heart.

The above-mentioned polyvinylidene fluoride is a piezoelectric material that converts mechanical energy into electrical energy, or electrical energy into mechanical energy. In recent years, a development of technology by using a piezoelectric material to detect biological signals, typically the above-mentioned respiratory activity of the lungs and heartbeat, that is, the biological signals are captured as mechanical energy and converted into electrical energy by the piezoelectric material for monitoring the signals is actively underway as described in PTL 2. Detection devices with multi-touch functions that can track the input pressure have also been made. In the detection device, the pressure (i.e., mechanical energy) applied to the polyvinylidene fluoride is converted into voltage (i.e., electrical energy), and then in which it is then amplified, denoised, added up, and subjected to analog-to-digital conversion, and the pressure is monitored on a computer, thereby using the device for touch panels, energy harvesters, nursing care environments (also known as intelligent floors) and security applications (PTL 3).

As a pressure detector, a traditional switch which have an electrode on a base board to be pressed widely exist. It is consisting of a box which a button on the box can be pushed, and a terminal over the box which can be contacted to the electrode by pushing the button. The switch acts by pushing the button to the bottom of the base board (PTL 4).

A field effect transistor which flows current corresponding to a pressure is also considered as a switch. In PTL 5, a piezoelectric material and the transistor are combined and realize a pressure sensor.

A pressure sensor is not only imparted with a piezoelectric material, but with a material which changes its electrical resistance due to applied pressure. Such a device has a structure that includes a recess formed by etching the bottom of a single-crystal silicon board, a pressure-strained part formed to be exposed at the bottom of the recess, a strain gauge provided on an active layer above the recess, and a conductive layer formed on the active layer with an insulating layer therebetween (PTL 6).

For pressure-sensitive sensors, gripping devices, and robots, PTL 7 points out that although PVDF is said to be flexible, its deformation range is within the strain range of the PVDF which Young's modulus is about 2 GPa, and thus PVDF is too stiff for a sensor material to apply as a sensor material for high sensitivity. PTL 7 also suggests that the PVDF as a pressure-sensitive sensor utilizing the piezoelectric phenomenon, which generates a voltage signal by deformation of the PVDF, poses the following problems. Sufficient time is required for applying a load to deform PVDF, thereby increasing the time from the moment the pressure-sensitive sensor contacts the object to be gripped to the moment the sensor outputs voltage signals, which reduces the sensitivity of pressure detection at the time of the contact, especially when the object to be gripped is soft, like a sponge of a rubber composition such as silicon.

PTL 8 discloses a similar invention relative to a wiring board equipped with a pressure sensing sensor that can be suitably used as a pressure detection sensor represented by a skin tactile sensor of a humanoid robot. PTL 8 also teaches that a piezo plastic film is preferably a porous piezo plastic film. The reason for the preference is that a porous piezo plastic film has piezoelectricity and not pyroelectricity, so the film is advantageously not easily affected by temperature changes. In addition, voltage is generated only by stress in the thickness direction, and almost no voltage is generated by tension in the plane direction, and thus it is not necessary to determine the spacing between the disposed pressure sensing sensors in view of the elongation in the plane direction, thereby facilitating the increase of the number of pressure-sensitive parts. A PVDF piezo plastic film is susceptible to noise, and in order to reduce such noise generation, it is necessary to increase the spacing between the disposed pressure sensing sensors to a certain extent, which limits the number of pressure-sensitive parts. In the pressure sensing sensor made of a porous piezo plastic film, voltage is generated only by stress in the thickness direction, and almost no voltage is generated by tension in the plane direction. Thus it is not necessary to determine the spacing between the disposed pressure sensing sensors in view of the elongation in the plane direction, thereby facilitating the increase of the number of pressure-sensitive parts.

The inventions of sensors for applications of healthcare devices, switches, and robots are exemplified above, but in these applications, it is beginning to require that the sensors can be applied to three-dimensional objects with curved surfaces. As it is necessary to attach sensors to things to absorb information such as position, temperature, humidity, illuminance, and pressure to achieve the IoT society, such objects are often three-dimensional objects with curved or uneven surfaces, from the viewpoint of design in recent years. The development of sensors made from materials that can flexibly adapt to such surfaces has begun. The above-described printed electronics, such as printing devices, printing materials, and board materials for forming circuit wiring on curved and uneven surfaces, are expected to contribute as elemental technologies.

As an example of the growing efforts to form sensors and circuit wiring on curved surfaces, PTL 9 discloses that three-dimensional printed circuits and touch sensors can be prepared by using a conductive paste with excellent adhesion that does not cause breakage of the conductive part even when the paste is heated and stretched. Specifically, the three-dimensional printed circuits and touch sensors are prepared by printing a conductive paste for molding process made of agglomerated silver particles by screen printing on a thermoplastic resin base material having a glass transition temperature of 80° C. or lower, and then vacuum molding by heat deformation into a three-dimensional structure. This method is characterized by the fact that the conductive part follows the molded shape during the molding to elongate and deform up to 140%, which prevents wire breakage, but the conductive part cannot be directly formed on a three-dimensional structure such as a curved surface.

PTL 10 discloses a method for preparing a capacitive touch panel board having a curved shape by thermal molding of a flat capacitive touch panel board having electrodes formed thereon by sputtering. In this method, thermostable resins higher than 190° C. of the thermal molding temperature, such as acrylic resin (PMMA), polycarbonate (PC), cyclo-olefin polymer (COP), and polyethylene terephthalate (PET) are utilized as transparent resins for touch panel board. The PTLs 9 and 10 both disclose capacitive sensors prepared by heat deformation.

As described above, many kinds of piezoelectric sensors which are not capacitive sensors made of piezoelectric materials that convert mechanical energy into electrical energy or electrical energy into mechanical energy have been developed, but these sensors are typically prepared as planar forms, as exemplified in PTLs 2 and 3. The piezoelectric sensors are normally based on the property of converting mechanical energy into electrical energy, where the mechanical energy is caused by pressure deformation and the electrical energy equals to a voltage signal.

An offset printing machine has been developed forming a circuit wiring on a curved surface. According to this method, provided are a printing plate, a blanket, a stage for fixing and transporting an object to be printed, the first machine movement while the printing plate surface and the blanket surface are in contact with each other, and the second machine movement while the blanket surface and the surface of the object to be printed fixed on the stage are in contact with each other. The blanket to be used is made of PDMS rubber wrapped around a metal cylinder. A conductive metal paste transferred onto the PDMS rubber is printed on a curved surface or uneven surface to be suited to those surfaces during the printing. The printed circuit wiring becomes to be electrically conductive by subsequent thermal sintering (PTL 11).

CITATION LIST

Patent Literature

PTL 1
Japanese Patent No. 6259390
PTL 2
Japanese Patent No. 6369919
PTL 3
Japanese Patent Application Laid-Open No. 2018-136954
PTL 4
Japanese Patent No. 6447492
PTL 5
Japanese Patent No. 6008970
PTL 6
Japanese Patent No. 4965274
PTL 7
Japanese Patent No. 6471812
PTL 8
Japanese Patent Application Laid-Open No. 2013-178241
PTL 9
WO2019/039209
PTL 10
WO2015/045325
PTL 11
Japanese Patent No. 6517058

SUMMARY OF INVENTION

Technical Problem

Not all polymer films shown in PTL 1 can be applied to the printed electronics. Metal pastes and metal particle inks to form electrodes and wiring, and functional electronic materials such as the above described piezoelectric materials typically require sintering temperatures of 100 to 200° C. Heating a polymer film at a temperature higher than its glass transition temperature does not necessarily mean that the polymer film will be deformed such that it cannot be used as a substrate material, however, under stressed conditions, the polymer film changes into a rubbery state, causing the printed circuit to deviate from its initial position, and also deformation such as distortion of the polymer film board. PET has a glass transition temperature of 77° C. and PPS has a glass transition temperature of 100° C., which are not suitable for sintering at 100 to 200° C. under stressed conditions because the materials will be deformed under such conditions. Since glass transition temperatures of PEN, PEEK, PPS, PAR and PC are higher than 100° C., these polymers can withstand sintering at 100 to 200° C. under stressed conditions, but on the other hand, these polymers are difficult to convert to film boards by solution process and thus they are not suitable for the purpose of the above-described thickness reduction.

Furthermore, colored PIs such as Upilex (registered trademark) and Kapton (registered trademark) are yellow to brown in color, and electronic devices using these colored PIs as polymer film boards have low transparency. For the development of the latest electronic devices, transparency becomes to be an important aspect in such devices. Considering consumer demands that "incorporated into a daily life" and "casually present", such colored PIs may stand out in the areas where they are used. Most importantly, use of the above polymer film as a board causes electrode formation defects when a conductive ink or a paste is printed and sintered, finding it impossible to achieve the defective rate of 0.1% or less for electronic device production required by the market. It is desirable to achieve a non-defective rate at least 98.0% preferably, more preferably 99.9% or higher, from viewpoints of economic efficiency of consumers, quality assurance and preventing from accidents.

Above-described devices in PTL 2 and 3 can monitor in real time by a computer, but those devices cannot instantly display in vision, touch or hearing, when pressure is applied to the devices. The sensing device fabricated on PET as board is prepared by forming electrodes and a ferroelectric layer that shows piezoelectricity by printing, and subsequent sintering at 100° C. for a short time. In this process, depending on contents of solvents or additives contained in pastes for the electrodes or the ferroelectric layer, the sintering at 100° C. for a short time may not be sufficient to remove the solvents or additives, resulting in operation failure. In addition, it is not preferable to apply prolonged sintering at 100° C. or higher, because the PET is more likely to be deformed as described above.

The pushbutton switch described in PTL 4 is widely used and inexpensive, but the button protrudes from the base board at least on the order of millimeters, and thus reduction of the thickness to the order of micrometers is impossible. Also, the switch needs to be set on a flat surface, and thus matching the switch to complex shapes such as curved surfaces is difficult.

In addition, the pressure sensor described in PTL 5 may not respond to weak pressure. In this pressure sensor, the gate, source, and drain electrodes constituting the field-effect transistor are disposed on one substrate, which means requiring a complex structure on the substrate. PEN and PI are used for the board, however, it is found that non-defective rate (for determining whether the device can be stably driven) of the switching device is low when Teonex (registered trademark) as a PEN polymer film, and Upilex (registered trademark) or Kapton (registered trademark) as a yellow to brown PI polymer film to form uniform surface of the electrodes and the ferroelectric layer by using a printing method.

Regarding the above-described thickness reduction by the solution process, PEN is difficult to apply for a solution by using an organic solvents. In addition, for an electronic device not standing out in the areas where it is used, yellow to brown PIs such as Upilex (registered trademark) and Kapton (registered trademark) are not desirable because such PIs are visually stood out due to their low total light transmittance in the visible wavelength range.

The pressure sensor described in PTL 6 uses single-crystal silicon, thus has a limit in the thinness and does not have the lightness and flexibility which properties are characteristics of polymer films. In this electrical resistance change type device, the electronic device does not operate unless pressure is constantly applied, so the device is not suitable to utilize to switch between an on and an off state with once-applied pressure.

The pressure-sensitive sensor or pressure sensing sensor for robots exemplified in PTLs 7 and 8 has excellent detection capability, but is not a sensor which can detect strain stress on three dimensions objects, and pursues the function as a flat surface sensor on the finger of a robot hand. When piezoelectric sensing capability of the sensor in a porous or sponge state is pursued, the sensor does not seem realistic for repeated contact impacts.

The invention of PTLs 9 and 10 for forming a sensor on a curved surface is a capacitive-type sensor that detects a weak electric current or change in the amount of electric charge. The sensor can detect contact to a living body, but not a non-living object because the non-living object does not cause a change in electric current. Electrical resistance of the capacitive sensor on a curved surface increases due to elongation of the conductive part during molding, and materials for the sensor are limited since multiple functional layers are stacked and their each curvature should be considered. Furthermore, the sensors cannot be easily incorporated into three-dimensional structures which are produced in small quantities for various products and have variable curved surfaces. Since piezoelectric sensors generate voltage due to deformation caused by pressure, regardless whether the object is a living body or a non-living object, the piezoelectric sensors can sense the slight contact with various objects. Therefore, when the piezoelectric sensors can be formed on curved or uneven surface of a three-dimensional object, possibilities to sense everything will expand. Although it is possible to form simple circuit wiring on a three-dimensional structure using a printing method (PTL 11), it is necessary to develop technology for a functional sensor to detect information received from outside environment.

As described above, printed electronics are considered to be industrially a very important technology, and energetic research and development is proceeded. An electric device having features that it is inexpensive, lightweight, and using a thin polymer film board fabricated by printing and sintering wires and a functional electronic materials such as piezoelectric materials by printing technology can apply for welfare medical applications, wearable device applications, RFID applications, transistor applications for, for example, smartphones, tablets, computers and displays, sensors or controllers for, for example, medical, nursing beds, crime prevention, childcare, self-driving automobiles, pet robots and drones, and electronic components for, for example, organic EL, liquid crystal displays, lighting, automobiles, robots, electronic glasses and music players. In addition, providing electronic devices with sensor functions that are bendable, flexible, and able to follow various three-dimensional shapes will be necessary as one of the solutions for the future problems.

The present invention can provide a tactile sensor with the following features and a device with a switching function by use of the tactile sensor. The tactile sensor is light, flexible, and tough, so that the sensor is applicable to a variety of three-dimensional objects, for example, to a flat surface and a curved surface of the three-dimensional objects; the total light transmittance of the thin film as a board is high, so that the sensor does not stand out in the area where it is disposed; the thickness reduction is possible since a polymer thin film can be formed from varnish; and the tactile sensor can be stably driven at a high non-defective rate.

Solution to Problem

The present invention relates to a tactile sensor including a first electrode printed on surface of a polyimide thin film having a specific high total light transmittance, where the polyimide thin film has a glass transition temperature of 250° C. or higher and 310° C. or lower, a tensile strength of 250 MPa or less, an elongation rate of 30% or less, a total light transmittance of 80% or more, and a polar component of its surface free energy of 1.5 to 10 mJ/m$^2$; a printed ferroelectric layer covering the first electrode; and a second electrode printed on the ferroelectric layer so as to be superposed above the first electrode. The tactile sensor generates a voltage signal when a living body, such as a finger, touches the electrode. The present invention also relates to a switching device that enhances to drive another device via an electronic circuit that controls noise from the living body or environment mixed in the voltage signal.

Advantageous Effects of Invention

The present invention can provide light, thin, flexible, and tough switching device that can be formed on surface of various shapes, including a flat surface and a curved surface of three-dimensional objects with a high non-defective product rate. The switching device enhances to drive another device by a light touch to the sensor part, which is composed of electrodes, a ferroelectric layer and a polyimide thin film having a specific high total light transmittance. The switching device is provided by using a printing technology that allows the switching device to suit to surrounding area where the switching device is disposed.

DESCRIPTION OF EMBODIMENTS

Hereinafter, embodiments of the present invention will be described.

Figure 1:
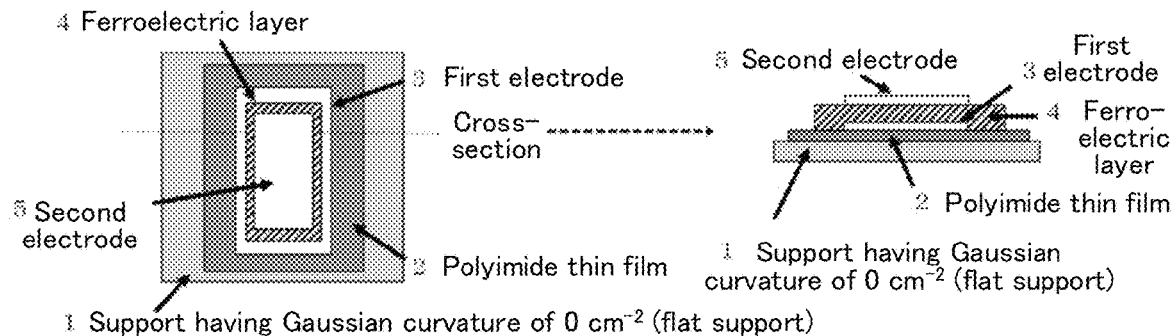
FIG. 1 illustrates the stacked structure of a tactile sensor formed by using a support having Gaussian curvature of 0 cm$^{-2}$ and the stacked structure of a tactile sensor formed by using a support having Gaussian curvature of 0.04 cm$^{-2}$ or less in absolute value.
Figure 1:
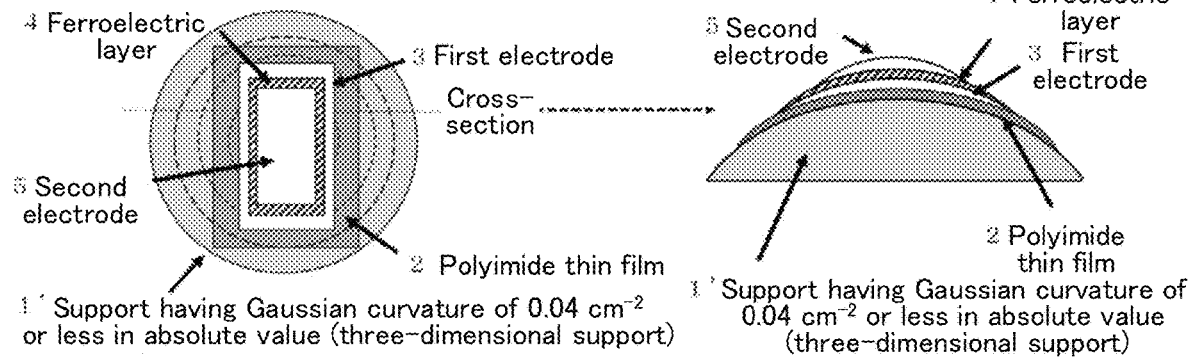

The configuration of a tactile sensor according to the present embodiment is described with reference to FIG. 1. In the present embodiment, polyimide thin film 2 is obtained in a form of a film and fixed on the surface of a support having Gaussian curvature of 0 $cm^{-2}$ (hereinafter referred to as flat support) 1; or the polyimide thin film 2 is formed on the surface of the flat support 1 through the process of coating the surface with varnish described below, or polyimide thin film 2 is formed on the surface of a support having Gaussian curvature of 0.04 $cm^{-2}$ or less in absolute value (hereinafter referred to as a three-dimensional support) 1' through the process of coating the surface with varnish described below. Polyimide thin film 2 prepared in such a manner is used as the forms attached on the supports. Flat support 1 or three-dimensional support 1' is a support only necessary for the process to prepare a tactile sensor, and after preparing the tactile sensor, the tactile sensor may be used not only as a form to be attached to the surface of flat support 1 or three-dimensional support 1', but a form to be peeled off and attached to another flat surface or three-dimensional objects for use.

When polyimide thin film 2 is obtained as a film state and fixed to the flat support 1 for printing first electrode 3, ferroelectric Layer 4, and second electrode 5 described below, the printing is usually performed under a temperature of 10 to 40° C., and thus the flat support 1 with low heat resistance can be used. Specifically, examples of the support include glass, metal, and plastic. Examples of the glass are not particularly limited, and include soda lime glass, quartz glass, or borosilicate glass. The metal is also not particularly limited, but iron, aluminum, titanium, nickel, copper, silver, tungsten, platinum, gold and alloys such as stainless steel can be used. The plastics can be also used without problems, even materials that do not have sufficiently high heat resistance, such as polypropylene (PP), polystyrene (PS), polyvinyl chloride (PVC), and PET. However, these materials are able to use only for the printing process. In the sintering process of the first electrode 3, the ferroelectric Layer 4, and the second electrode 5 described below, when the sintering is performed while first electrode 3, ferroelectric Layer 4, and second electrode 5 are fixed to the flat support 1, the flat support 1 should be selected from a point of view of the heat resistance of the support.

On the other hand, for forming polyimide thin film 2 on the surface of flat support 1 or on the surface of three-dimensional support 1' through the process of coating with varnish described below, the materials such as glass and metal described above can be used, but plastic materials should be specifically limited. Specifically, since the varnish is a polyamic acid varnish which is a starting material for polyimide thin film 2 requiring dehydration and cyclization reactions by sintering at 280 to 320° C., the support needs to have heat resistance of 280 to 320° C. The support is thus preferably a plastic material selected from polyphenylene sulfide (PPS), polyimide (PI), polytetrafluoroethylene (PTFE), polyamide-imide (PAI), and the like which exhibit heat resistance at the above temperature.

Three-dimensional support 1' according to the present embodiment will be described. Regarding the surface represented by the Gaussian curvature, a plane surface can be taken from a normal vector perpendicular to the curved surface at any one point on the curved surface. A cross-section line described in two-dimensional coordinates is obtained by the overlap of the plane surface and the curved surface. When the cross-section line is a curve, the curvature can be obtained by approximating the curve to an arc (in detail, the curvature is the reciprocal of the radius of the arc). When a cross-section line is taken in each direction to 360° by the overlap of the plane surface and the curved surface, the curvature in each direction to 360° is obtained. The product of the maximum value and minimum value of the curvature is called as the Gaussian curvature, which can be explained to quantify the state of the curved surface. The Gaussian curvature being a positive value represents a convex surface, and the Gaussian curvature being a negative value represents a concave surface. Although the sharpness or smoothness of the curved surface cannot be sensorily understood by an absolute value of the Gaussian curvature, the larger the absolute value, the sharper the shape of the curve, and the smaller the absolute value, the smoother the shape of the curve.

In case of a flat surface, the cross-section line thereof is a straight line, thus the straight cross-section line is approximated to an infinitely large circle, and the minimum value of its curvature is considered to be zero. Therefore, the Gaussian curvature of the flat surface is regarded as zero. A side surface of a cylinder or a cone is sensorily felt to be a curved surface, but when a normal vector at any point on the surface and the plane surface crossing the normal vector are taken, the plane surface and the surface, the cross-section appears to be a quadrangle in case of the cylinder and an isosceles triangle in case of the cone, and thus the cross-section line is a straight line and the minimum value of curvature is zero. Therefore, the Gaussian curvature of a cylinder or a cone is regarded as zero.

The absolute value of the Gaussian curvature is found to be preferably 0.04 $cm^{-2}$ or less in the present embodiment, that is, for a curved surface that can be approximated to a spherical surface, the surface having a curvature radius of 5 cm or more, which is defined as the reciprocal of the curvature, is preferred. As the absolute value of the Gaussian curvature is noted to be 0.04 $cm^{-2}$ or less, the present embodiment also includes a surface having Gaussian curvature of zero, such as flat objects, cylinders, and cones which Gaussian curvatures are also zero.

For a curved surface having an absolute value of Gaussian curvature more than 0.04 $cm^{-2}$, it is found to be difficult to form the polyimide thin film 2, the first electrode 3, the ferroelectric layer 4, and the second electrode 5 on the three-dimensional support 1', because of the described reason as follows. In the present embodiment, since the polyimide thin film 2, the first electrode 3, the ferroelectric layer 4, and the second electrode 5 are formed on the three-dimensional support 1' by printing or applying in forms of liquid states such as varnish, paste, or ink, the liquids would easily flow to the direction of gravity on the curved surface having an absolute value of Gaussian curvature more than 0.04 $cm^{-2}$. This phenomenon is more noticeable when a component with low surface tension is contained in the liquids. Especially, when printing or applying a varnish of the ferroelectric layer 4 that contains a copolymer whose constituent units are vinylidene fluoride and trifluoroethylene having fluorine atoms, the flow phenomenon easily occurs because of low surface tension due to fluorine atoms.

In the present invention, it was found that the absolute value of Gaussian curvature has a possible maximum value for forming the ferroelectric layer 4 on a curved surface with some thickness, that is, the sharpness of the curved surface has a limited extent, because of the effect of the surface tension described above. It was confirmed that the varnish of the ferroelectric layer 4 flew on a curved surface having an absolute value of Gaussian curvature more than $0.04$ $cm^{-2}$, and as a result, an uniform layer the ferroelectric layer 4 without defects cannot be formed.

A varnish for forming polyimide thin film 2, and the a paste or an ink for forming first electrode 3 and second electrode 5 which does not have as low a surface tension as the varnish of the ferroelectric layer 4 may be possible to be printed or applied even on a curved surface having an absolute value of Gaussian curvature more than $0.04$ $cm^{-2}$, but, when the absolute value of Gaussian curvature is, for example, more than $1$ $cm^{-2}$, not only handling difficulty of the paste or ink, but also it is difficult for a printing machine to print the paste or ink because of the operating limitation of the machine. Because of these reasons, the absolute value of Gaussian curvature is preferably $0.04$ $cm^{-2}$ or less in the present embodiment.

The polyimide thin film 2 having high total light transmittance according to the present embodiment is a polyimide that can be formed into a film by reacting a diamine compound having an alicyclic structure with a tetracarboxylic dianhydride. The polyimide thin film 2 has a glass transition temperature of 250° C. or higher and 310° C. or lower, a tensile strength of 250 MPa or less, an elongation rate of 30% or less, a total light transmittance of 80% or more, and a polar component of its surface free energy of 1.5 to 10 $mJ/m^2$ and has a constituent unit represented by the following general formula (1).

General Formula (1)

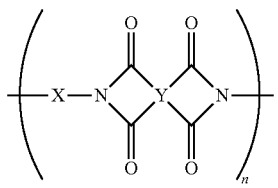

where X is at least one member selected from the group consisting of the following alicyclic groups:

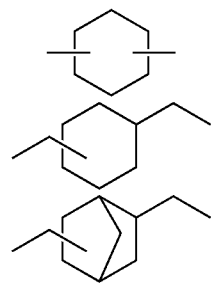

where Y is at least one member selected from the group consisting of the following aromatic groups:

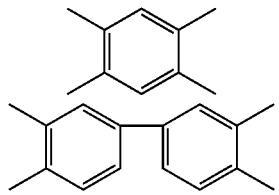

In the present embodiment, the polyimide thin film 2 in a form of a film may be used. Alternatively, the polyimide thin film 2 can be formed by coating on the surface of the flat support 1 or on the surface of the three-dimensional support 1' with a varnish of a polyamic acid represented by general formula (2), which is the starting material for the polyimide, and subsequent heating at 280 to 320° C. for removal of some organic solvents contained in the varnish and for dehydration/cyclization reaction of the polyamic acid.

General Formula (2)

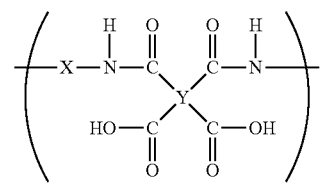

The varnish of the polyamic acid represented by the general formula (2) is formed by reacting a diamine compound having an alicyclic structure with a tetracarboxylic dianhydride in some organic solvents.

The diamine compound used as the starting material for the polyamic acid represented by the general formula (2) is preferably selected from 2,5-diaminomethyl-bicyclo[2,2,1]heptane, 2,6-diaminomethyl-bicyclo[2,2,1]heptane, 1,4-cyclohexanediamine, and 1,4-bis(aminomethyl)cyclohexane; and the tetracarboxylic dianhydride is preferably selected from pyromellitic dianhydride and 3,3',4,4'-biphenyltetracarboxylic dianhydride. When these diamine compounds are used, X in formula (1) is at least one alicyclic group selected from the group consisting of the following structures:

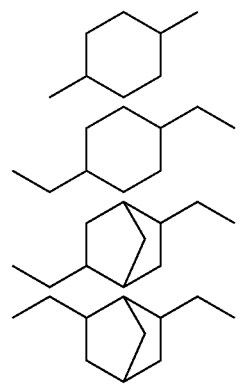

When the diamine compound used as the starting material for the polyamic acid represented by the general formula (2)

is 2,5-diaminomethyl-bicyclo[2,2,1]heptane, the stereoisomers of 2,5-diexo-diaminomethyl-bicyclo[2,2,1]heptane, 2-endo-5-exo-diaminomethyl-bicyclo[2,2,1]heptane, 2,5-diendo-diaminomethyl-bicyclo[2,2,1]heptane are applicable. When the diamine compound is 2,6-diaminomethyl-bicyclo[2,2,1]heptane, the stereoisomers of 2,6-diexo-diaminomethyl-bicyclo[2,2,1]heptane, 2-endo-6-exo-diaminomethyl-bicyclo[2,2,1]heptane and 2,6-diendo-diaminomethyl-bicyclo[2,2,1]heptane are applicable. When the diamine compound is 1,4-cyclohexanediamine, the stereoisomers of cis-1,4-cyclohexanediamine and trans-1,4-cyclohexanediamine are applicable. When the diamine compound is 1,4-bis(aminomethyl)cyclohexane, the stereoisomers of cis-1,4-bis(aminomethyl)cyclohexane and trans-1,4-bis(aminomethyl)cyclohexane are applicable. These isomers may be used individually or in a mixture thereof.

Other examples of the diamine compound for use may be cyclobutanediamine, cyclohexanediamine, di(aminomethyl)cyclohexane, diaminobicycloheptane, diaminomethylbicycloheptane such as norbornanediamine, diaminooxybicycloheptane, diaminomethyloxybicycloheptane including oxanorbornanediamine, isophoronediamine, diaminotricyclodecane, diaminomethyltricyclodecane, bis(aminocyclohexyl)methane [or methylenebis(cyclohexylamine)], and bis(aminocyclohexyl)isopropylidene. The above-described structures may have a substituent(s) that is effective to be relatively stable under some environment such as heat, air, water, light and humidity.

Examples of the tetracarboxylic dianhydride may be 3,3',4,4'-benzophenonetetracarboxylic dianhydride, bis(3,4-dicarboxyphenyl) ether dianhydride, bis(3,4-dicarboxyphenyl) sulfide dianhydride, bis(3,4-dicarboxyphenyl) methane dianhydride, 2,2-bis(3,4-dicarboxyphenyl) propane dianhydride, 2,2-bis(3,4-dicarboxyphenyl)-1,1,1,3,3,3-hexafluoropropane dianhydride, 1,3-bis(3,4-dicarboxyphenoxy) benzene di anhydride, 1,4-bis(3,4-dicarboxyphenoxy) benzene dianhydride, 4,4'-bis(3,4-dicarboxyphenoxy) biphenyl dianhydride, 2,2-bis [(3,4-dicarboxyphenoxy) phenyl] propane di anhydride, 2,3,6,7-naphthalenetetracarboxylic dianhydride, 1,4,5,8-naphthalenetetracarboxylic dianhydride, 2,2', 3,3'-benzophenonetetracarboxylic dianhydride, 2,2',3,3'-biphenyltetracarboxylic dianhydride, 2,2-bis(2,3-dicarboxyphenyl)-1,1,1,3,3,3-hexafluoropropane dianhydride, bis(2,3-dicarboxyphenyl) ether dianhydride, bis(2,3-dicarboxyphenyl) sulfide dianhydride, bis(2,3-dicarboxyphenyl) sulfone dianhydride, 1,3-bis(2,3-dicarboxyphenoxy) benzene dianhydride, 1,4-bis(2,3-dicarboxyphenoxy) benzene dianhydride, 1,2,5,6-naphthalenetetracarboxylic dianhydride, 1,3-bis(3,4-dicarboxybenzoyl) benzene dianhydride, 1,4-bis(3,4-dicarboxybenzoyl) benzene dianhydride, 1,3-bis(2,3-dicarboxybenzoyl) benzene dianhydride, 1,4-bis(2,3-dicarboxybenzoyl) benzene dianhydride, 4,4'-oxydiphthalic dianhydride, diazodiphenylmethane-2,2',3,3'-tetracarboxylic dianhydride, 4-(2,5-dioxotetrahydrofuran-3-yl)-tetralin-1,2-dicarboxylic acid dianhydride, and 3,3,4,4-dicyclohexyltetracarboxylic dianhydride. The above-described structures may have a substituent(s) that is effective to be relatively stable under some environment such as heat, air, water, light and humidity.

The organic solvent to solve the polyamic acid represented by the general formula (2) in the varnish is not particularly limited as long as it is a solvent that allows the diamine and the tetracarboxylic dianhydride to dissolve therein. Examples of the organic solvent include phenol-based solvents such as phenol, o-chlorophenol, m-chlorophenol, p-chlorophenol, o-cresol, m-cresol, p-cresol, 2,3-xylenol, 2,4-xylenol, 2,5-xylenol, 2,6-xylenol, 3,4-xylenol, and 3,5-xylenol; aprotic solvent or its kinds of amide-based solvents such as N,N-dimethylformamide, N,N-dimethylacetamide, N,N-di ethyl acetamide, N-methylacetamide, N-methyl-2-pyrrolidone, 1,3-dimethyl-2-imidazolidinone, N-methylcaprolactam, and hexamethylphosphorotriamide; ether-based solvents such as 1,2-dimethoxyethane, bis(2-methoxyethyl) ether, 1,2-bis(2-methoxyethoxy) ethane, tetrahydrofuran, bis[2-(2-methoxyethoxy)ethyl] ether, 1,4-dioxane, 2-methoxyethanol, 2-ethoxyethanol, 2-(methoxymethoxy) ethoxyethanol, 2-isopropoxyethanol, 2-butoxyethanol, tetrahydrofurfuryl alcohol, diethylene glycol, diethylene glycol monomethyl ether, diethylene glycol monoethyl ether, diethylene glycol monobutyl ether, triethylene glycol, triethylene glycol monoethyl ether, tetraethylene glycol, 1-methoxy-2-propanol, 1-ethoxy-2-propanol, dipropylene glycol, dipropylene glycol monomethyl ether, dipropylene glycol monoethyl ether, tripropylene glycol monomethyl ether, polyethylene glycol, polypropylene glycol, and diethylene glycol diethyl ether; amine-based solvents such as pyridine, quinoline, isoquinoline, α-picoline, β-picoline, γ-picoline, isophorone, piperidine, 2,4-lutidine, 2,6-lutidine, trimethylamine, triethylamine, tripropylamine and tributylamine; water-soluble alcohol solvents such as methanol, ethanol, 1-propanol, 2-propanol, tert-butyl alcohol, ethylene glycol, 1,2-propanediol, 1,3-propanediol, 1,3-butanediol, 1,4-butanediol, 2,3-butanediol, 1,5-pentanediol, 2-butene-1,4-diol, 2-methyl-2,4-pentanediol, 1,2,6-hexanetriol, and diacetone alcohol; and other solvents such as dimethylsulfoxide, dimethylsulfone, diphenyl ether, sulfolane, diphenylsulfone, tetramethylurea, anisole, benzene, toluene, o-xylene, m-xylene, p-xylene, chlorobenzene, o-dichlorobenzene, m-dichlorobenzene, p-dichlorobenzene, bromobenzene, o-dibromobenzene, m-dibromobenzene, p-dibromobenzene, o-chlorotoluene, m-chlorotoluene, p-chlorotoluene, o-bromotoluene, m-bromotoluene, p-bromotoluene, acetone, methyl ethyl ketone, methyl isobutyl ketone, cyclopentanone, cyclohexanone, γ-butyrolactone, pentane, hexane, heptane, cyclohexane, dichloromethane, chloroform, tetrachloromethane, fluorobenzene, methyl acetate, ethyl acetate, butyl acetate, methyl formate, and ethyl formate. These solvents may be used individually or as a mixture of these two or more solvents.

Among these solvents, aprotic solvent or its kinds of amide-based solvents are preferable, and N, N-dimethylformamide, N, N-dimethylacetamide, N,N-diethylacetamide, N-methylacetamide, N-methyl-2-pyrrolidone, 1,3-dimethyl-2-imidazolidinone, N-methylcaprolactam, and hexamethylphosphorotriamide are more preferable.

When a tensile strength of a formed polyimide thin film 2 exceeds 250 MPa, the film is noticeably stiff and unsuitable from a point of view of flexibility. There is a correlation between a tensile strength and a glass transition temperature of one material, and from the viewpoint of the tensile strength described above, the glass transition temperature should be 310° C. or lower. A film that is easily stretched cannot retain printed shape such as electrodes, so the elongation rate should be 30% or less, and the total light transmittance should be 80% or more in order not to stand out in the area where the tactile sensor is disposed.

The film thickness of the polyimide thin film 2 according to the present embodiment is 1 to 500 μm, preferably 1 to 350 μm, and more preferably 1 to 100 μm.

The first electrode 3 on the polyimide thin film 2 according to the present embodiment can be formed by printing and subsequent sintering a metal particle ink, a metal paste, a conductive carbon material, a conductive polymer material, or a conductive organic compound.

Specifically, examples of the metal particle ink and metal paste for use include metal particles of, for example, gold, silver, copper, nickel, zinc, aluminum, calcium, magnesium, iron, platinum, palladium, tin, chromium, and lead; metal alloys such as silver/palladium; thermally decomposable metal compounds, which are thermally decomposed at a relatively low temperature to give a conductive metal such as silver oxide, organic silver, and organic gold; and metal oxide particles of, for example, zinc oxide (ZnO) and indium tin oxide (ITO). Metals such as gold, silver, and copper are particularly suitable for the use. Though the volume resistivity are variable depending on metal sorts to be used and sintering conditions, it should be preferably $1.0 \times 10^{-6}$ to $1.0 \times 10^{-2}$ $\Omega \cdot cm$.

Also, examples of the conductive carbon material are acetylene black, furnace carbon black, thermal carbon black, graphite, and carbon nanotubes. The volume resistivity is different depending on the materials to be used and their sintering conditions, it should be preferably $1.0 \times 10^{-3}$ to $10$ $\Omega \cdot cm$. Examples of the conductive polymer material include conjugated organic compounds such as polythiophene, polyethylenedioxythiophene/polystyrene sulfonic acid (hereinafter referred to as PEDOT/PSS), polyaniline, polypyrrole, polyacetylene, polyparaphenylene, and polyparaphenylene vinylene, and derivatives thereof. The volume resistivity is different depending on the materials to be used, concentrations of dopants, and sintering conditions, it should be preferably $1.0 \times 10^{-5}$ to $1.0 \times 10^{2}$ $\Omega \cdot cm$.

Publicly-known metal particle inks, metal pastes, conductive carbon materials, conductive polymer materials, and conductive organic compounds can be fixed their viscosities by adding some solvents. These viscosities at 25° C. of room temperature are, for example, in the range of 0.001 to 1,200 Pa·s, and preferably 1 to 500 Pa·s.

Examples of the additional solvents include alcohols such as methanol, ethanol and butanol, ethers such as tetrahydrofuran, diethyl ether, dibutyl ether, dimethoxyethane and dioxane, aromatic hydrocarbons such as benzene, toluene, xylene, and ethylbenzene, aliphatic hydrocarbons such as, pentane, hexane, and heptane, aliphatic cyclic hydrocarbons such as cyclopentane, cyclohexane, methylcyclohexane, dimethylcyclohexane, and decalin, halogenated hydrocarbons such as methylenedichloride, dichloroethane, dichloroethylene, tetrachloroethane, chlorobenzene, and trichlorobenzene, and esters such as methyl acetate and ethyl acetate, though the examples are not particularly limited thereto. These solvents may be used in individual or in combination.

A leveling agent or a polymer compound may be added into metal particle inks, metal pastes, conductive carbon materials, conductive polymer materials, and conductive organic compounds to complement their functionalities. For example, an acrylic resin and/or an epoxy resin may be added in order to impart adhesiveness or adjust elasticity.

Although not in all cases, after the tactile sensor was fabricated, it might be peeled off from three-dimensional support 1' to attach to another three-dimensional object with similar Gaussian curvature. At this time, a large stress may be applied to the sensor. A metal paste to which some elastomers are added (hereinafter referred to as a stretchable conductive paste) may be better to use to relieve the stress.

The first electrode 3 according to the present embodiment can be minimize its size in order not to stand out on a flat surface or on a surface of a three-dimensional object where the sensor is finally deposited. In detail, making size of the electrodes as small as possible and arranging the electrodes in an array at a certain density for the sensor not to stand out. The size of the electrodes is not particularly limited, but each of the electrodes are formed to have a size in the range of $5.0 \times 10^{-3}$ to 25 $cm^2$, preferably in the range of $1.0 \times 10^{-2}$ to 15 $cm^2$. The shape of the electrodes is also not particularly limited, but, for example, a triangle, a quadrangle, a pentagon, a hexagon, a circle, an ellipse, or a combination of these shapes is preferred.

Printing methods using the metal particle ink, the metal paste, the conductive carbon material, the conductive polymer material, the conductive organic compound, or the stretchable conductive paste as the first electrode 3 on the polyimide thin film 2 include soft blanket gravure offset printing, inkjet printing, a dispenser, screen printing, gravure offset printing, flexo printing, letterpress reverse printing, spin coating, spray coating, blade coating, dip coating, cast coating, roll coating, bar coating, and die coating. Various electrode materials described above may be used choosing among the printing methods. However, when printing the electrode materials on the polyimide thin film 2 deposited on the three-dimensional support 1' having a curved surface with an absolute value of Gaussian curvature of 0.04 $cm^{-2}$ or less, soft blanket gravure offset printing, inkjet printing capable of printing on three-dimensional objects, and a dispenser capable of applying on three-dimensional objects are suitable methods. When soft blanket gravure offset printing is used, polydimethylsiloxane (hereinafter referred to as PDMS) rubber, which has low surface free energy and hydrophobic property, or the like is often used for the soft blanket, thus it is preferable to use a metal particle ink and a metal paste containing a hydrocarbon-based organic solvents, a conductive polymer material containing an alcohol solvent mainly, or a stretchable conductive paste.

The first electrode 3 printed by one of these printing methods on the polyimide thin film 2 with the above-described metal particle ink, metal paste, conductive carbon material, conductive polymer material, conductive organic compound, or stretchable conductive paste is then sintered and form an electrode layer on the polyimide thin film 2. The sintering can be operated under atmosphere or an inert gas such as nitrogen or a rare gas. During the printing and sintering process, the substrates should be better to fix with a heat-resistant tape, by vacuum suction, or by adhesion on a hard table or plate having a smooth surface, such as glass, stainless steel, or high heat-resistant plastic.

The sintering temperature is 80 to 200° C., preferably 80 to 180° C., and more preferably 80 to 160° C. As a result, an uniform and strong adhesion or fusion interface can be formed between the polyimide thin film 2 and the first electrode 3. It is also possible that sintering methods by light using a Xenon lamp or heating in an infrared oven are applicable to form the first electrode 3 made of a metal particle ink or a metal paste. The thickness of the first electrode 3 thereby formed is preferably in the range of 100 nm to 1,000 μm, more preferably 500 nm to 100 μm, and more preferably 500 nm to 10 μm.

For the ferroelectric layer 4 according to the present embodiment, a vinylidene fluoride polymer and/or a copolymer containing vinylidene fluoride and trifluoroethylene as constituent units are used, but the present invention is not limited thereto. Polymers containing these constituent units with fluorine atoms have three types of crystal structures: α-type, β-type, and γ-type. Only the β-type crystal structure among the three types has a high dielectric constant and ferroelectricity by giving polarization due to an electric field. This ferroelectricity leads to show piezoelectricity, thereby allowing the use as a tactile sensor, thus it is important to form a β-type crystal structure effectively. Polyvinylidene fluoride consisting of vinylidene fluoride as a single monomer, usually forms an α-type structure and needs to be converted to a β-type structure by an uniaxial orientation (or stretching) of the α-type structure, which requires a huge equipment for the orientation and molding. On the other hand, a copolymer consisting of vinylidene fluoride monomer and trifluoroethylene monomer can easily form a β-type crystal structure by printing method of its solution. Considering use of printing methodologies, copolymers having vinylidene fluoride monomer and trifluoroethylene monomer as the constituent units are preferable.

In particular, regarding molar ratio of vinylidene fluoride/trifluoroethylene, a higher ratio of vinylidene fluoride, which is more likely to form an α-type crystal structure, increases the remnant polarization when an electric field is applied, resulting in excellent ability to convert small deformations into voltage signals, namely the piezoelectricity. From a viewpoint of preferential formation of the above-described β-type crystal structure and expression of high piezoelectricity, it is preferable to use a vinylidene fluoride/trifluoroethylene copolymer (hereinafter referred to as P(VDF-TrFE)) with the molar ratio of vinylidene fluoride/trifluoroethylene of 95/5 to 50/50. The molar ratio is more preferably 90/10 to 70/30, and more preferably 80/20 to 70/30.

A method utilizing varnish of the P(VDF-TrFE) with an organic solvent to form the ferroelectric layer 4 is preferable. The method for applying the varnish is not particularly limited, and examples thereof include soft blanket gravure offset printing, inkjet printing, a dispenser, screen printing, gravure offset printing, flexo printing, letterpress reverse printing, spin coating, spray coating, blade coating, dip coating, cast coating, roll coating, bar coating, and die coating, as the methods for coating on the first electrode 3 to form the ferroelectric layer 4. Examples of printing methods for coating on the first electrode 3 when supported by the three-dimensional support 1' include soft blanket gravure offset printing, inkjet printing capable of printing on three-dimensional objects, and a dispenser capable of applying on three-dimensional objects, and dropping.

The organic solvents for the P(VDF-TrFE) varnish to form the ferroelectric layer 4 are not particularly limited, and examples of the solvents include toluene, xylene, mesitylene, decahydronaphthalene, N-methyl-2-pyrrolidone, anisole, γ-butyrolactone, chlorobenzene, dichlorobenzene, tri chlorobenzene, tetralin, 1-methylnaphthalene, 1,4-diisopropylbenzene, diethylene glycol monobutyl ether, propylene glycol 1-monomethyl ether 2-acetate, butyl acetate, ethanol, and butanol. After coating the varnish, it is heated to remove the solvent, forming the P(VDF-TrFE) layer which mainly has a β-type crystalline structure. At this heating process, it is necessary for formation of the P(VDF-TrFE) layer with the β-type crystalline structure to remove its initial polarity by heating under a temperature higher than its Curie temperature which is a specific temperature losing polarity of the copolymer, and then the layer should be slowly cooled to a temperature at which the transition to the β-type crystalline structure occurs. The heating temperature is 50 to 150° C., preferably 60 to 140° C., and more preferably 90 to 140° C.

Thickness of the ferroelectric layer 4 formed in such a way is not particularly limited, but considering its polarization should be promoted by applying a relatively low electric field from points of view of safety and economy, the thickness is preferably 0.5 to 15 μm. It is more desirable the thickness is 1.0 to 7.0 μm for forming the ferroelectric layer without defects and obtaining the above-described remnant polarization with low electric field application.

The second electrode 5 to be formed on the ferroelectric layer 4 after the above-described process can be formed by printing and sintering an electrode with a metal particle ink, a metal paste, a conductive carbon material, a conductive polymer material, a conductive organic compound, or a stretchable conductive paste as same as formally described first electrode 3 so as to be superposed with the first electrode 3 in the cross-sectional direction.

Publicly-known metal particle inks, metal pastes, conductive carbon materials, conductive polymer materials, conductive organic compounds, and stretchable conductive pastes can be used in the present embodiment. As with the first electrode 3, the viscosities of these components at 25° C. of room temperature are, for example, in the range of 0.001 to 1,200 Pa·s, and preferably 1 to 500 Pa·s. The viscosity can be adjusted with a solvent.

As similar to the first electrode 3, examples of the additional solvents include alcohols such as methanol, ethanol and butanol, ethers such as tetrahydrofuran, diethyl ether, dibutyl ether, dimethoxyethane and dioxane, aromatic hydrocarbons such as benzene, toluene, xylene, and ethylbenzene, aliphatic hydrocarbons such as, pentane, hexane, and heptane, aliphatic cyclic hydrocarbons such as cyclopentane, cyclohexane, methylcyclohexane, dimethylcyclohexane, and decalin, halogenated hydrocarbons such as methylenedichloride, di chloroethane, dichloroethylene, tetrachloroethane, chlorobenzene, and trichlorobenzene, and esters such as methyl acetate and ethyl acetate, though the examples are not particularly limited thereto. These solvents may be used in individual or in combination.

As similar to the first electrode 3, a leveling agent or a polymer compound may be added into metal particle inks, metal pastes, conductive carbon materials, conductive polymer materials, conductive organic compounds and stretchable pastes to complement their functionalities. For example, an acrylic resin and/or an epoxy resin may be added in order to impart adhesiveness or adjust elasticity.

As similar to the first electrode 3, the size of the electrodes is not particularly limited, but each of the electrodes are formed to have a size in the range of $5.0 \times 10^{-3}$ to 25 cm$^2$, preferably in the range of $1.0 \times 10^{-2}$ to 15 cm$^2$. The shape of the electrodes is also not particularly limited, but, for example, a triangle, a quadrangle, a pentagon, a hexagon, a circle, an ellipse, or a combination of these shapes is preferred.

Printing methods using the metal particle ink, the metal paste, the conductive carbon material, the conductive polymer material, the conductive organic compound, or the stretchable conductive paste as the second electrode 5 on the ferroelectric layer 4 fabricated on formally described each laminate on the flat support 1 include soft blanket gravure offset printing, inkjet printing, a dispenser, screen printing, gravure offset printing, flexo printing, letterpress reverse printing, spin coating, spray coating, blade coating, dip coating, cast coating, roll coating, bar coating, and die coating. Various electrode materials described above may be used choosing among the printing methods. When printing the electrode materials on the ferroelectric layer 4 fabricated on formally described each laminate on the three-dimensional support 1' having a curved surface with an absolute value of Gaussian curvature of 0.04 cm$^{-2}$ or less, soft blanket gravure offset printing, inkjet printing capable of printing on three-dimensional objects, and a dispenser capable of applying on three-dimensional objects are suitable methods. When soft blanket gravure offset printing is used, PDMS rubber, which has low surface free energy and hydrophobic property, or the like is often used for the soft blanket, thus it is preferable to use a metal particle ink and a metal paste containing a hydrocarbon-based organic solvents, a conductive polymer material containing an alcohol solvent mainly, or a stretchable conductive paste.

The second electrode 5 printed by one of these printing methods on the ferroelectric Layer 4 with the above-described metal particle ink, metal paste, conductive carbon material, conductive polymer material, conductive organic compound, or stretchable conductive paste is then sintered and form an electrode layer on the ferroelectric layer 4. The sintering can be operated under atmosphere or an inert gas such as nitrogen or a rare gas. During the printing and sintering process, the substrates should be better to fix with a heat-resistant tape, by vacuum suction, or by adhesion on a hard table or plate having a smooth surface, such as glass, stainless steel, or high heat-resistant plastic.

Unlike sintering conditions of the first electrode 3, sintering of the second electrode 5 needs to be set in view of a Curie temperature of the ferroelectric Layer 4. That is, the ferroelectric Layer 4 is necessary to be heated at a temperature equal to or lower than its Curie temperature so as not to change its β-type crystalline. The heating temperature is 50 to 140° C., preferably 60 to 130° C., and more preferably 90 to 130° C. It is also possible that sintering methods by light using a Xenon lamp or heating in an infrared oven or the like are applicable for sintering of the second electrode 5 made of the metal particle ink or metal paste, but the temperature should be within the above-described range. The thickness of the second electrode 5 formed by the above process is preferably in the range of 100 nm to 1,000 μm, more preferably 500 nm to 100 μm, and further preferably 500 nm to 10 μm. The volume resistivity of the electrode is variable depending on the material used and the sintering conditions in view of the Curie temperature, but the range is similar to that of the first electrode 3.

Applying an electric field through the first electrode 3 and the second electrode 5 allows the ferroelectric Layer 4 of the present embodiment to have a structure polarized toward the direction of the electric field application. When the ferroelectric Layer 4 and the electrodes are properly formed, a polarization-electric field hysteresis loop (hereinafter referred to as PE loop) is drawn, and a value of the polarization when the electric field is zero in the loop, that is, remnant polarization can be obtained. The vinylidene fluoride/trifluoroethylene constituting the P (VDF-TrFE) has a molar ratio in the range of 95/5 to 50/50, and has a remnant polarization depending on the crystallinity of 1 to 20 μC/cm$^2$, preferably 2 to 15 μC/cm$^2$, and more preferably 3 to 10 μC/cm$^2$. The remnant polarization leads to show piezoelectricity that generates a voltage signal when the ferroelectric Layer 4 is deformed by pressure. By use of the piezoelectricity, a tactile sensor that detects contact when pressure is applied by a human finger or the like can be obtained as the present invention. The tactile sensor is found to have the remnant polarization of 6.5 to 9.0 μC/cm$^2$.

The tactile sensor may be used as a form of being attached to the flat support 1 or the three-dimensional support 1' where the tactile sensor is formed, or may be peeled off from the support and attached to another flat surface or three-dimensional object for use. When the tactile sensor is attached to another flat surface or a three-dimensional object for use, an adhesive or a double-coated tape that can adhere between the polyimide thin film 2 of the sensor and the object at a room temperature or higher may be placed therebetween. As heat resistance is not necessarily required for the flat surface or the three-dimensional object when the adhesive or a double-coated tape adhere at 25° C. of room temperature, a three-dimensional objects made of various materials such as plastic, glass, metal, and paper can be employed.

Figure 2:
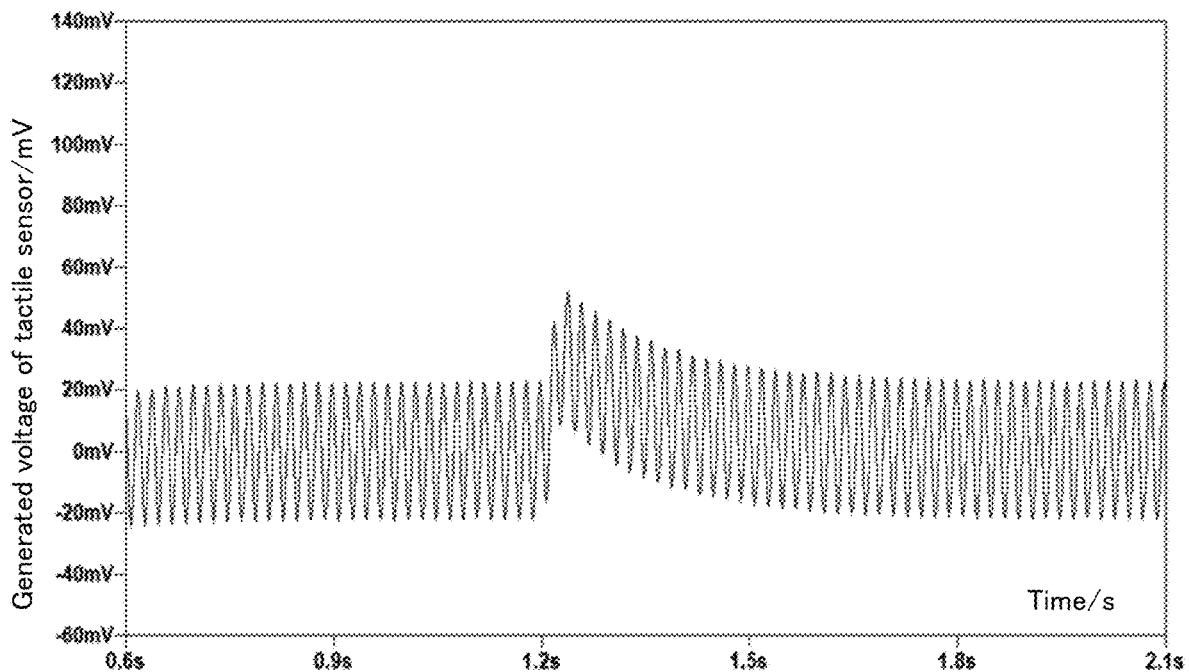
FIG. 2 shows a generated voltage waveform that is mixed with noise received by the human body itself or its surrounding environment when a finger touches to the tactile sensor part.

In addition, either the first electrode 3 or the second electrode 5 of the tactile sensor may be grounded as a ground electrode, and the other one facing to the ground electrode may be connected to a specific electronic circuit. This configuration makes it possible to control noise received by a human body and its surrounding environment, and transmission of the voltage signal generated by the tactile sensor in the present embodiment. The main causes of the noise are, for example, a 50 Hz or 60 Hz AC commercial power supply, and vibration of a flat surface or a three-dimensional object to which a tactile sensor is attached. FIG. 2 shows a typical situation of a touching voltage signal with noise from an AC commercial power supply signals. FIG. 2 shows that the contact is detected at the point of the highest voltage value, which is then attenuated, and the noise from the 50 Hz AC commercial power supply signals are in combination. A method for controlling the noise and extracting sole of the contact as a voltage signal is not particularly limited, examples of the method are coverage of the first electrode 3 and the second electrode 5 with a protective electromagnetic wave shielding film (such as a conductive material, an external electrode, and an insulating material); a coaxial cable for wiring; various filter circuits (such as low-pass filter, high-pass filter, and band-pass filter); and a comparator circuit. These methods are possible to be combined.

It is also possible to design an electronic circuit that detects even a weak pressure of contact to the tactile sensor. The method for detecting weak pressure is not particularly limited, and examples thereof include amplification of the generated voltage by an operational amplifier. It is found that the surface free energy of the polyimide thin film 2 according to the present embodiment affects the performance of the tactile sensor.

That is, it is found that when the above-described metal particle ink, metal paste, conductive carbon material, conductive polymer material, conductive organic compound, or stretchable conductive paste is coated on the polyimide thin film 2 as the first electrode 3, and when the ferroelectric Layer 4 is coated on the first electrode 3, their formation states after heat treatment depends on the surface free energy of the polyimide thin film 2. This energy can be divided into a polar component and a dispersive component, and the total amount of these components is at least 15 to 80 mJ/m$^2$, more preferably 25 to 70 mJ/m$^2$, and particularly preferably 30 to 60 mJ/m$^2$. Each component can be measured by the contact angles by droplets of different liquids on the film.

In detail, in this embodiment of the present invention, it is clarified that not only values of the sum of the components but the polar component is more influential than the dispersive component. The range of the surface free energy of the polar component is 1.5 to 10 mJ/m$^2$, preferably 2.0 to 8.0 mJ/m$^2$, and even more preferably 2.5 to 6.0 mJ/m$^2$. The tactile sensor can be utilized by generation of the voltage signal arisen from touching the sensor fabricated on the polyimide thin film 2 with an electronic circuit capable of eliminating noise.

Using the tactile sensor prepared as described above and the voltage signal arisen from touching the sensor with the circuit to eliminate noise combined with the signal, it makes it possible to obtain a switching device that switches the voltage state between an on and an off state. The circuit configuration for the switching is not particularly limited, and examples thereof include various flip-flop circuits (such as reset-set flip-flop, delay-flip-flop, JK-flip-flop and toggle-flip-flop made of delay-flip-flop), but it is better to use a toggle-flip-flop circuit made of delay-flip-flop from a point of view of simplification of the device configuration and ease of its purchase.

Here, a typical production method for the present embodiment is explained. The polyimide thin film 2 according to the present embodiment is formed via a polyamic acid varnish. That is, the diamine compound and the tetracarboxylic dianhydride are dissolved in an organic solvent such as N-methyl-2-pyrrolidone to generate a polyamic acid and thus form a varnish. For applying the varnish on the surface of the flat support 1 of borosilicate glass, for example, the blade coater is used. For applying the varnish on the surface of the three-dimensional support 1' made of a spherical surface of a borosilicate glass whose curved surface has an absolute value of Gaussian curvature of 0.04 cm$^{-2}$ or less, soft blanket gravure offset printing is used.

A polyimide thin film 2 is obtained by sintering the coated polyamic acid on the support in an inert gas such as nitrogen or in a reduced pressure atmosphere at 320° C. for 2 hours. In many cases, it is convenient for fabrication process to proceed to the subsequent formation of a first electrode 3, a ferroelectric Layer 4, and a second electrode 5 while the polyimide thin film 2 is attached to the flat support 1 or the three-dimensional support 1'. Peeling off the polyimide thin film 2 from flat support 1 or three-dimensional support 1' and proceeding to the subsequent process are also possible if necessary.

In the present embodiment, an alcohol solution of PEDOT/PSS (manufactured by Heraeus) is printed as a first electrode 3, for example, by screen printing when it is printed on the polyimide thin film 2 on the flat support 1, and by soft blanket gravure offset printing when it is formed on the polyimide thin film 2 on the three-dimensional support 1', then the first electrode 3 of the PEDOT/PSS with a thickness of 100 nm to 1,000 µm is formed by a thermal sintering.

Subsequently, a varnish of a P (VDF-TrFE) dissolved in N-methyl-2-pyrrolidone is applied on the first electrode 3 by using a blade coater on the polyimide thin film 2 and the flat support 1, or the varnish is dropped onto the first electrode 3 by a syringe on the polyimide thin film 2 and the three-dimensional support 1'. The solvent is removed by thermal sintering at 50 to 150° C., and a P (VDF-TrFE) layer having a β-type crystal structure and a thickness of 0.5 to 15 µm is obtained. The PEDOT/PSS is applied onto the P (VDF-TrFE) layer in the same manner as for the first electrode 3, and sintered at 50 to 140° C. to obtain a second electrode 5 having a thickness of 100 nm to 1,000 Applying an electric field to the P (VDF-TrFE) through the first electrode 3 and the second electrode 5 leads to a polarized structure toward a direction in which the electric field is applied to exhibit piezoelectricity, thereby a tactile sensor is obtained.

As a method for elimination of noise mixed into the contact pressure from outside, an active-type filter that uses an operational amplifier including active elements like a transistor is more suitable rather than a passive-type filter that uses only passive elements like a resistor and a capacitor. For example, electronic characteristics of a passive-type low-pass filter illustrated in FIG. 3 and the active-type Sallen-Key low-pass filter illustrated in FIG. 4 are compared. Voltages among frequency range of 100 MHz to 100 Hz are input to the circuits of FIGS. 3 and 4, and the gain represented by the following equation is calculated.

$$\mathrm{Gain} \cdot (\mathrm{dB}) = \cdot 20 \cdot \times \cdot \log\left(\frac{\mathrm{Output} \cdot \mathrm{voltage} \cdot (\mathrm{V})}{\mathrm{Input} \cdot \mathrm{Voltage} \cdot (\mathrm{V}) \cdot}\right) \quad \text{Equation 1}$$

Figure 3:
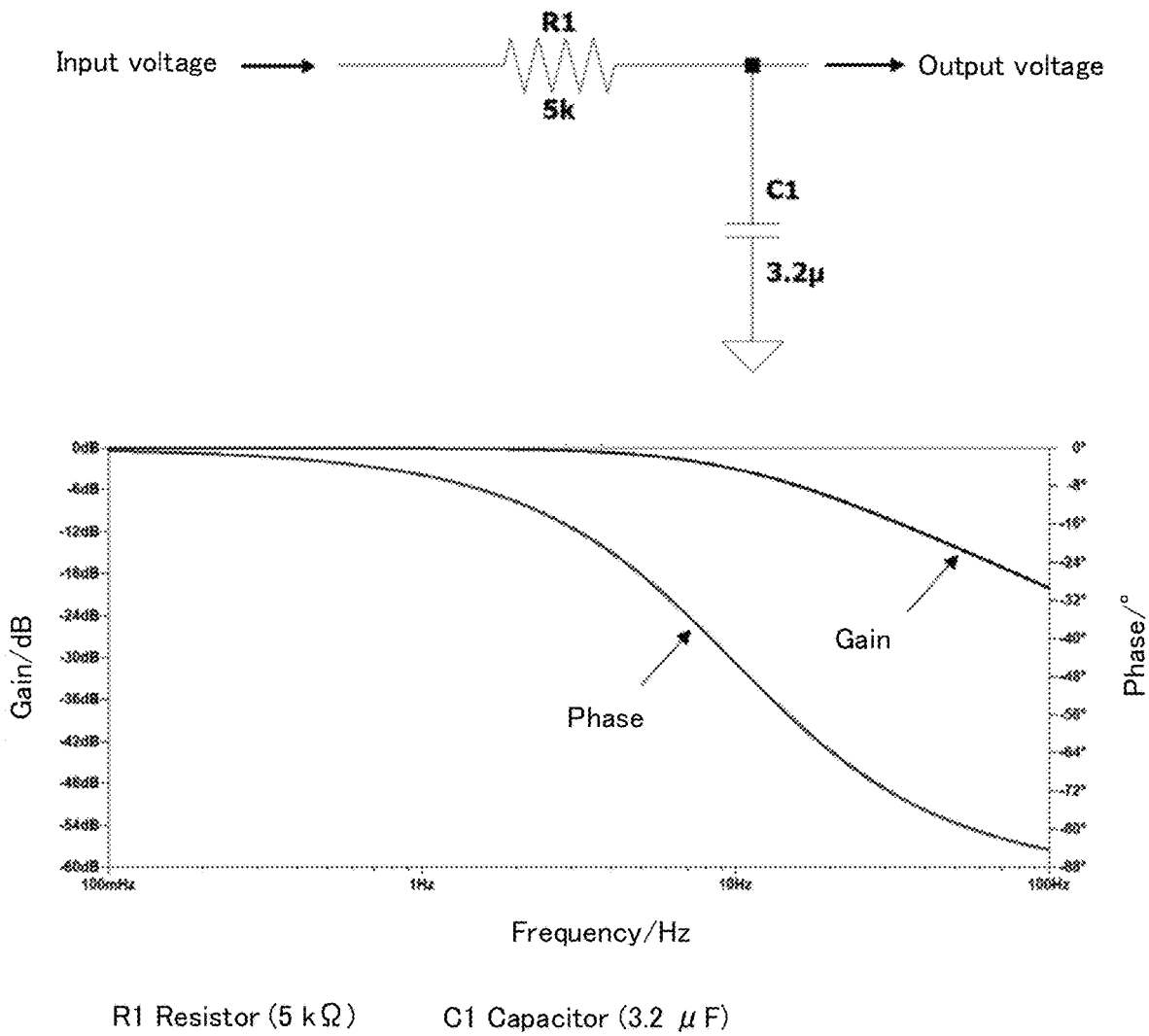
FIG. 3 shows a circuit example when an RC low-pass filter is used to remove noise of a commercial power supply frequency (50 Hz) and the frequency dependence of its gain.
Figure 4:
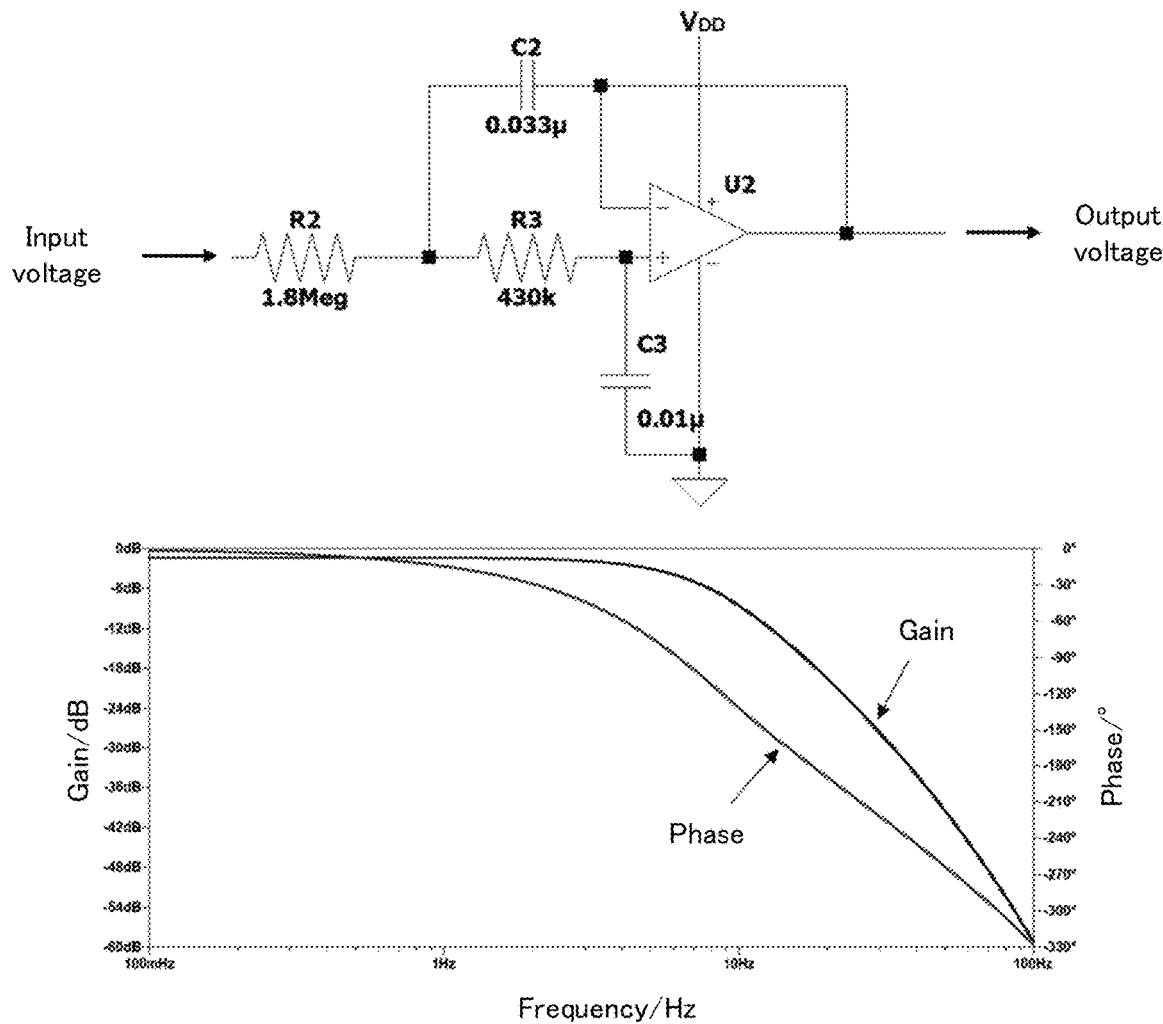
FIG. 4 shows a circuit example of a Sallen-Key low-pass filter for removing noise of a commercial power supply frequency (50 Hz) and the frequency dependence of its gain.

Comparing the frequency dependence of the gains shown in FIG. 3 and in FIG. 4, the active-type Sallen-Key low-pass filter in FIG. 4 has a significantly lower gain than the filter of FIG. 3 at frequency of 50 Hz and higher, and it is obvious that the noise at frequency of 50 Hz and higher is attenuated by passing through the Sallen-Key low-pass filter. As a result, detection of a sole contact to an object is possible. The active low-pass filter is not limited to the Sallen-Key low-pass filter illustrated in FIG. 4, and may be configured by another appropriate active low-pass filter according to other types of noise.

Figure 6:
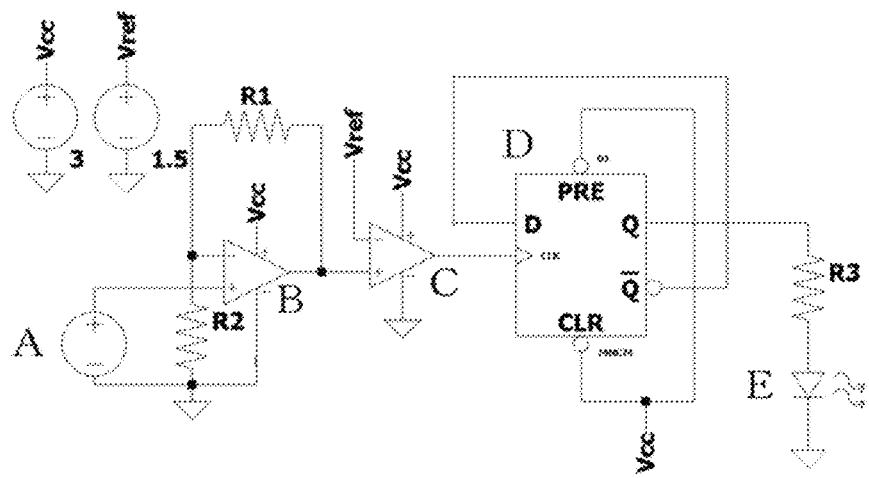
FIG. 6 illustrates a switching device, namely an electronic circuit connected to one of the tactile sensors of Examples 1 to 6, with a switching function that controls generated voltage mixed with noise by a human body itself and its surrounding environment.
Figure 7:
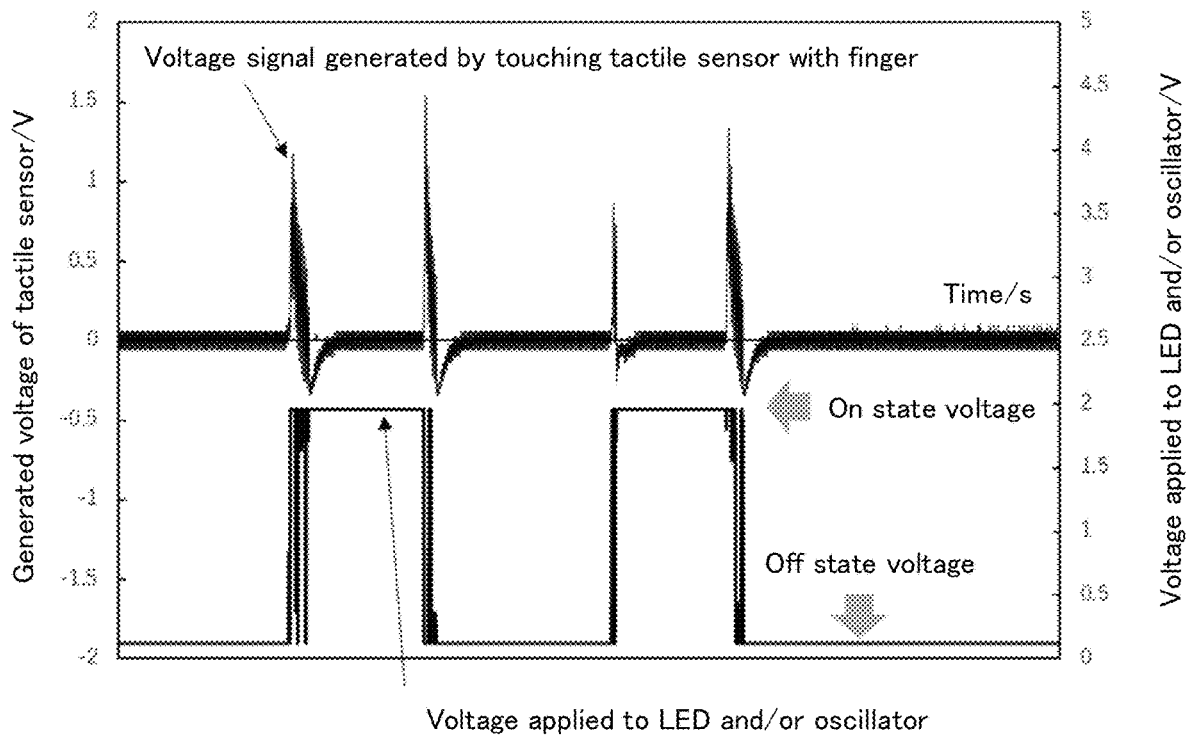
FIG. 7 shows voltage signals to convert between an on and an off state so that they promote a LED's on and off, and a vibrator's on and off, by touching the sensor generating a voltage signal with controlled noise when using the switching device in Example 1.

The above-described active type filter is a noise control method based on a so-called analog electronic circuit, but a digital circuit converting high state and low state can also be used for a noise control method. Specifically, when a voltage signal generated by touching the tactile sensor is amplified by an operational amplifier, noise combined within the signal is also amplified, but if connecting to a comparator which is one of the digital circuits, output voltage from the comparator when voltage is generated due to touching to the tactile sensor is set as the on state and noise which has lower voltage than the voltage signal due to touching is set as the off state. In addition, switching functionality is confirmed by providing the toggle-flip-flop illustrated in FIG. 6 as shown in Examples. As a result, as shown in FIG. 7, switching between an on and an off state of the voltage becomes possible by touching the tactile sensor with a finger. In order to make the switching function visually understand, a switching device that switches an on and an off state of the voltage applied to a LED and/or oscillator in response to a touching pressure with a finger has been implemented.

An on and an off state of the voltage may be perceived not only by vision but also by other senses such as touch and hearing. The switching device in the present embodiment may include a component such as LED and speaker in order to sensuously recognize the on and the off state of the voltage.

Figure 8:
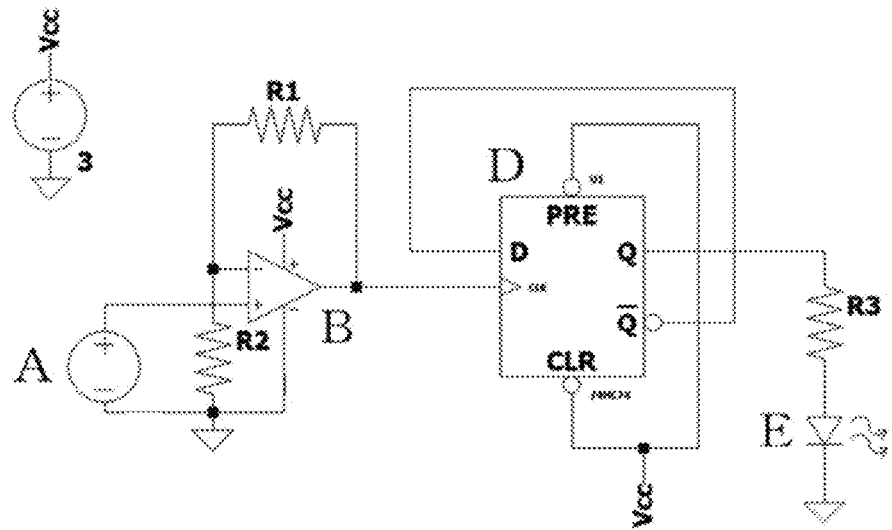
FIG. 8 shows an electronic circuit for the comparison in, for example, Comparative Example 6 that cannot control noise received by the human body itself and its surrounding environment.
Figure 9:
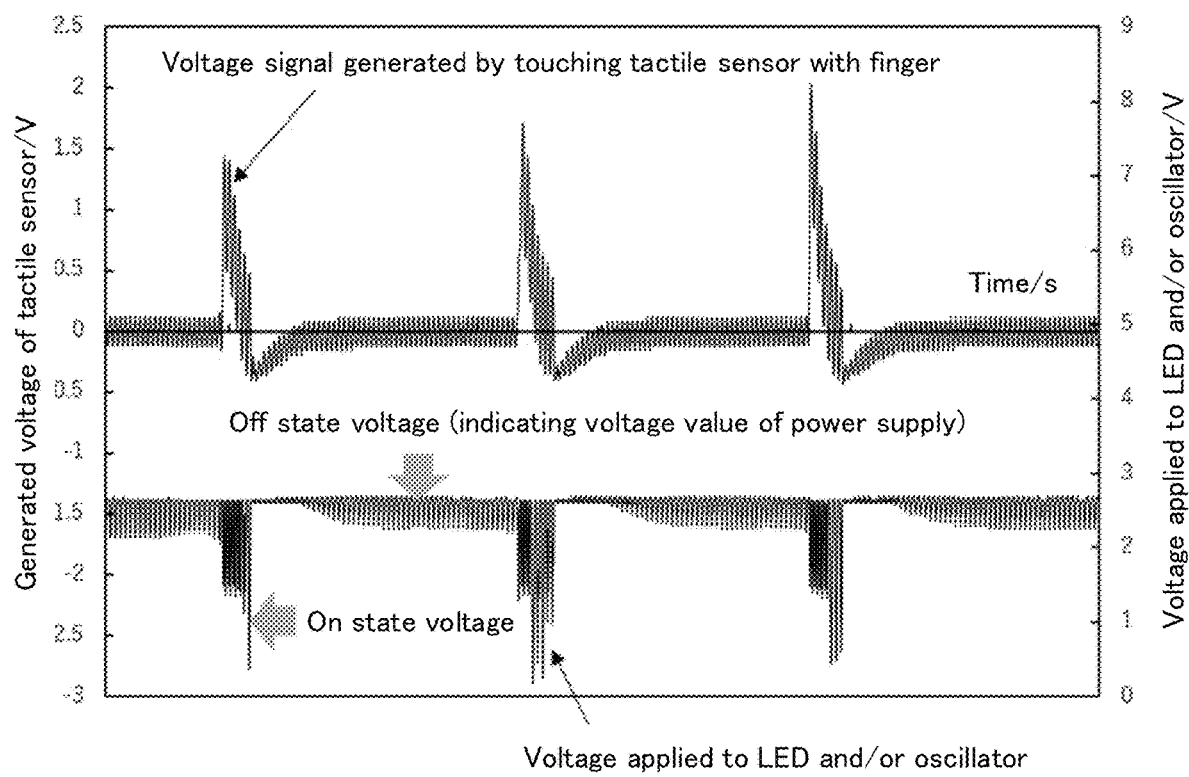
FIG. 9 shows, in the case of using the electronic circuit in FIG. 8, voltage states between an on and an off state cannot be switched when a finger touches the tactile sensor.

In the case of an electronic circuit including only an operational amplifier and a Toggle-flip-flop without a comparator (FIG. 8, as a comparative example), since the noise is amplified along with the touch of a finger, the on and the off state of the voltage after passing the toggle-flip-flop circuit become unstable, thus correct switching becomes impossible (FIG. 9).

Pressure detected by the tactile sensor is converted into a voltage signal, and the signal leads to switch between an on and an off state of its circuit in the present embodiment. As a result, a light-emitting diode such as a LED light or an organic EL, or an oscillator (vibrator) or other devices which are connected to the sensor are powered simultaneously. Also, it is possible to switch between an on state and an off state of, for example, the mechanical operation of a robot. The pressure that is converted into such a voltage signal to switch an on and an off state can be made by a light and soft touch by a finger. The main successful characteristic for this functionality is as follows: forming a first electrode, a ferroelectric layer, and a second electrode are laminated in this order on a polyimide film having a polar component of a surface free energy of 1.5 to 10 mJ/m$^2$ and high total light transmittance which properties are caused by the general formula (1), therefore, the characteristic leads to a sensor component of a transparent electronic device capable of working in response to an even weak voltage signal while maintaining the sensor shape. The thickness of this sensor is 5 to 100 μm, preferably 5 to 50 μm, and more preferably 5 to 10 μm.

In addition, when the above-described polyimide thin film is used as a board, defect of the electrodes don't occur after their inks or pastes are printed and sintered, and therefore, the defective rate of 0.1% or less for electronic devices required by the market can be achieved. A non-defective rate of the products of 99.9% or higher can be achieved, which is preferable from viewpoints of the economic efficiency to consumers, quality assurance and accident prevention.

A several application examples by the tactile sensor are described here. Information on the voltage signal of the tactile sensor and an on state and an off state of the switching device generated in this way are then digitized by analog-to-digital conversion and transmitted to a computer by a wireless communication to remotely monitor the information. Also, when the sensor is attached to, for example, surface of a robot, a mechanism for avoiding a strong collision between the robot and a human body or the like that the sensor contacts can be utilized.

In order to read the measured voltage changes on a computer or a device by a software, it is preferable to use wireless functions of smartphones, smartwatches and tablets which are widely utilized as communication tools in recent years, but wire communication with USB cables and jack cables are also possible.

These communication functions may use wireless communication called near field communication (NFC) using a frequency of 13.56 MHz that can be used for wireless power supply, and may also use wireless communication with international standards such as ISO/IEC 14443, 18092, 15693, and 21481, and the device using this communication is called as a passive-type electronic devices. Further, RFID function can be combined to the passive-type device as an IC tag. The sensor device can also be used as an active-type electronic device. In this case, though it is necessary to be equipped with a battery, Bluetooth Basic Rate/Enhanced Data Rate and Bluetooth Low Energy (to 5 m) which are available in 2.4 GHz frequency, UHF in 900 MHz band (for example, 920 MHz (to 100 m)) and ZigBee in 800 MHz band can be used. Further, the 0.7 to 2.0 GHz band of the 4G communication band, the 3.0 to 4.1 GHz band of the SGSub6 band, the 27.00 to 29.50 GHz band of the 5G millimeter wave band, and the like can also be used.

Especially in case of the passive-type devices, transmitting and receiving antenna for information communication may be formed on the tactile sensor of the present embodiment by printing technology to provide the above-described information communication function, thereby providing a bendable or stretchable electronic device.

To provide sensor devices economically and inexpensively, the tactile sensor may be provided with a device which utilizes various existing inexpensive integrated circuits (ICs) and resistors for controlling voltage in order to temporarily replace the physical quantity of information from a sensor with an electric signal to be processed by an electronic circuit, and further convert the electric signal to the physical quantity that can be read by humans. In such a device, the signal acquired by the electric circuit from the sensor is converted by using an AD converter that replaces from an analog signal to a digital signal so that humans can read the measurement result with the use of software.

In the present embodiment, mounted components, connection wiring and an electronic component are required to be installed in an economically inexpensive and durable manner on the above-described wiring board. Which is CMOS used for rectification and signal conversion and an integrated circuit (IC) of AD conversion circuit and flip-flop circuit, a resistor, an amplifier, a light emitter of a laser, organic EL, LED and the like, and is a communication device of NFC, Bluetooth, UHF, ZigBee and the like. In a mounting method, solder is a material that is generally used at low cost, also a low-temperature curing type flexible conductive adhesive can be used, which is a material that has the potential to be economical in the future, although it is expensive at the present stage.

The soldering method may be performed manually by soldering the thread using a soldering iron, but the flow method or the reflow method is an industrially commonly used method. Although any method may be used in the present embodiment, industrially preferred implementation of the electronic components and connection wiring is a method in which solder paste is printed by squeegee printing on the printed circuit board by using a screen such as a stainless steel metal mask having holes in the parts where electronic components are to be mounted, components are placed on the printed solder paste, and then heat is applied to melt the solder. After the electronic components and connection wiring are mounted, the tactile sensor board formed in the present embodiment and the mounted electronic component and the like may be preheated before the main heating in a reflow furnace to avoid sudden heat shock to the components, and flux activation, solvent vaporization and the like. The temperature of the preheat in the present embodiment is in the range of 100 to 150° C., and this may be performed at 140 to 180° C. in a short heating time. Further, the cooling may be natural cooling, but rapid cooling may also be performed to avoid thermal stress of the electronic components or to prevent solder shrinkage and cracks. Further, in place of the printing, a ball solder may be attached to the IC, placed on a mounting portion, and reflowed.

EXAMPLES

Hereinafter, the present invention will be specifically described with reference to Examples, but the present invention is not limited thereto. The defective rate of a tactile sensor herein means the yield of sensors that did not show an average remnant polarization of 7.0 μC/cm$^2$ among tactile sensors after all the fabrication processes. This defective rate was obtained by evaluating all the sensors 10 times.

Method for measuring glass transition temperature: A polyimide thin film was heated from 25° C. by thermomechanical analysis (TMA method), and the change point of the coefficient of linear expansion was defined as the glass transition temperature.

Method for measuring tensile strength and elongation rate: A polyimide thin film was pulled by the ASTM D638 method, which is a standard tensile test method for plastics, the maximum value of the stress observed in the test was defined as the tensile strength, and the strain corresponding to the stress was defined as the elongation rate.

Method for measuring total light transmittance: A polyimide thin film was formed on a flat glass plate under the same printing conditions as the polyimide thin film formed on a curved surface by soft blanket gravure offset printing. With a glass plate as the background, the film was irradiated with visible ultraviolet light in the range of 300 to 800 nm wavelength by a visible ultraviolet spectrophotometer, and the light transmittance at each wavelength is obtained from the ratio of the incident light and transmitted light. The average value in the range of 450 to 800 nm wavelength was defined as the total light transmittance.

Method for measuring thickness of electrode: Under the same printing conditions as the printing method used for forming an electrode on a curved surface (for example, soft blanket gravure offset printing, inkjet printing capable of printing on three-dimensional objects, and dispenser capable of printing on three-dimensional objects), an electrode the same as the electrode formed on the curved surface was printed on a flat polyimide thin film (described in claim 1) and sintered. After sintering the electrode, the surface of the polyimide thin film and the surface of the electrode were scanned with a Dektak (registered trademark) stylus profiler, and the average value of the steps was defined as the thickness of the electrode.

Method for measuring volume resistivity; The electrical resistance value (R) was measured by a two-terminal measuring method by placing terminals at both ends of a linearly formed electrode. The volume resistivity (p) was determined from the values of its length (L) between the two terminals and the cross-sectional area (A) using the equation below. In determining the cross-sectional area (A), the value obtained from the measurement of the thickness of the electrode was used as the thickness.

$$\text{Volume Resistivity } (\rho)/\Omega \cdot cm = \frac{\text{Resistance } (R)/\Omega \times \text{Cross-Sectional Area } (A)/cm^2}{\text{Length } (L) \text{ between Terminals}/cm} \quad \text{Equation 2}$$

Method for measuring Curie temperature: Into an aluminum pan, 2 to 5 mg of vinylidene fluoride/trifluoroethylene copolymer powder was accurately weighed, and heated from 20° C. to 200° C. at a temperature heating rate of 5° C./min by a differential scanning calorimeter (DSC). Then, the copolymer powder was cooled from 200° C. to 20° C. at a temperature cooling rate of 5° C./min, and both exothermic and endothermic change associated with the state change of the copolymer powder during a series of temperature change processes were measured. In the heating process, the copolymer shows a melting point at about 140 to 160° C. and changes into a liquid. At this time, a peak due to the endothermic change is confirmed. In the subsequent cooling process, a peak of exothermic change was confirmed at about 90 to 140° C., which is lower than the melting point, and the temperature at that peak was defined as the Curie temperature.

Example 1

A polyimide film (trade name: ECRIOS (registered trademark), VICT-C, manufactured by Mitsui Chemicals, Inc.) which features described below is fixed to a flat support with Gaussian curvature of 0 $cm^{-2}$ made of alkaline glass. The polyimide film has a glass transition temperature of 280° C., a tensile strength of 190 MPa, an elongation rate of 15%, a total light transmittance of 88%, and the total value of the surface free energy of 43.2 $mJ/m^2$ determined from the contact angles of water and diiodomethane (the polar component in the total surface free energy is 2.7 $mJ/m^2$). A water and alcohol solution of PEDOT/PSS (manufactured by Heraeus), which is a conductive polymer material, was applied on the polyimide film by screen printing as a form of a circle with a diameter of 1 cm, and the water and alcohol solvents were evaporated by heating at 150° C. for 30 minutes to form a first electrode in a circular shape with 1 cm diameter (area of 0.79 $cm^2$). The electrode had thickness of 2.0 and volume resistivity of 4.0 $\Omega \cdot cm$.

On the above film, 12 wt % N-methyl-2-pyrrolidone solution of Piezotech FC25 (manufactured by Arkema), which is P(VDF-TrFE) with a molar ratio of vinylidene fluoride/trifluoroethylene of 75:25, was applied by using a blade coater. The N-methyl-2-pyrrolidone was evaporated by heating at 135° C. for 2 hours, thereby forming a ferroelectric layer with thickness of 3 to 5 It was confirmed that the Curie temperature of Piezotech FC25 measured by a DSC was 130° C.

A water and alcohol solution of PEDOT/PSS (manufactured by Heraeus) was applied by screen printing on the ferroelectric layer, and the water and alcohol solvents were evaporated by heating at 125° C. for one hour, thereby forming a second electrode having thickness of 2.0 μm in a circular shape with 1 cm diameter (area of 0.79 $cm^2$). The second electrode is superposed with the first electrode toward the thickness direction with the ferroelectric layer therebetween.

The PE loop was obtained by applying an electric field to the ferroelectric layer through the first electrode and the second electrode, and the remnant polarization of the ferroelectric layer was evaluated. The obtained defective rate of the tactile sensors was 0% by the evaluation on the remnant polarization, that is, the non-defective rate was 100%.

The fabricated laminate obtained by the above processes was used as a tactile sensor. The tactile sensor was connected to a circuit consisting of an operational amplifier, a comparator, toggle flip-flop made from a delay flip-flop and red LED light as illustrated in FIG. 6, and it was observed that turning on (lit: on state) and off (unlit: off state) of the LED light was switched by touching the sensor with a finger. FIG. 7 shows the generation of a voltage signal when a finger touches the tactile sensor, and it also shows the on state of the voltage after passing the toggle-flip-flop, in other words, the voltage applied to the LED, and the on state was maintained and switched to the off state when tactile sensor was touched again.

In addition, an oscillator FA-130RA (rated voltage: 1.5V), manufactured by MABUCHI MOTOR CO., LTD, was connected in parallel to the LED terminal part of the avobe described circuit. When the tactile sensor is touched with a finger, the red LED was turned on and the oscillator is driven at the same time, and when the tactile sensor is touched again with a finger, the LED was turned off and the oscillator stops at the same time. A switching device with function of driving another device is confirmed by this device.

Example 2

The conductive polymer material solution of Example 1 was applied on the polyimide film with Gaussian curvature 0 $cm^{-2}$ used in the Example 1 by screen printing in the same manner as described in Example 1, and sintered to form a first electrode having thickness of 2.0 μm in a circular shape with 1 cm diameter (area of 0.79 $cm^2$).

On the first electrode, 12 wt % N-methyl-2-pyrrolidone solution of Piezotech FC20 (manufactured by Arkema), which is P(VDF-TrFE) with a molar ratio of vinylidene fluoride/trifluoroethylene of 80:20, was applied by using a blade coater in the same manner as in Example 1. The N-methyl-2-pyrrolidone was evaporated by heating at 145°

C. for 2 hours, thereby forming a ferroelectric layer with a thickness of 3 to 5 It was confirmed that the Curie temperature of Piezotech FC20 measured by a DSC was 140° C.

The same conductive polymer material solution as the formally described was applied by the same screen printing on the ferroelectric layer, and sintered at 135° C. for 30 minutes to form a second electrode having thickness of 2.0 μm in a circular shape with 1 cm diameter. The second electrode is superposed with the first electrode toward the thickness direction with the ferroelectric layer therebetween.

The PE loop was obtained by applying an electric field to the ferroelectric layer through the first electrode and the second electrode, and the remnant polarization of the ferroelectric layer was evaluated. The obtained defective rate of the tactile sensors was 0%, that is, the non-defective rate was 100%.

An operational amplifier, a comparator, toggle flip-flop made from a delay flip-flop and a red LED light were connected to the tactile sensor. Touching the tactile sensor with a finger turned the LED on (lit: on state), and touching the tactile sensor again turned the LED off (unlit: off state).

Example 3

The conductive polymer material solution was applied on the polyimide film with Gaussian curvature 0 cm$^{-2}$ used in the Example 1 by screen printing in the same manner as in Example 1, and heated at 150° C. for 30 minutes to evaporate water and alcohol solvents, thereby forming a first electrode having thickness of 2.0 μm in a circular shape with 1 cm diameter.

12 wt % N-methyl-2-pyrrolidone solution of Piezotech FC30 (manufactured by Arkema), which is P(VDF-TrFE) with a molar ratio of vinylidene fluoride/trifluoroethylene of 70:30, was applied on the first electrode by using a blade coater in the same manner as in Example 1. The N-methyl-2-pyrrolidone was evaporated by heating at 135° C. for 2 hours, thereby forming a ferroelectric layer with thickness of 3 to 5 It was confirmed that the Curie temperature of Piezotech FC30 measured by a DSC was 100° C.

The same conductive polymer material solution as above described was applied by screen printing in the same manner on the ferroelectric layer, and heated at 90° C. for one hour to form a second electrode having a thickness of 2.0 μm in a circular shape with 1 cm diameter (area of 0.79 cm$^2$). The second electrode is superposed with the first electrode toward the thickness direction with the ferroelectric layer therebetween.

The PE loop was obtained by applying an electric field to the ferroelectric layer through the first electrode and the second electrode, and the remnant polarization of the ferroelectric layer was evaluated. The defective rate of the tactile sensors was 0%, that is, the non-defective rate was 100%.

An operational amplifier, a comparator, toggle flip-flop made from a delay flip-flop and a red LED light were connected to the tactile sensor illustrated in FIG. 6. Touching the tactile sensor with a finger turned the LED on (lit: on state), and touching the tactile sensor again turned the LED off (unlit: off state).

Example 4

The conductive polymer material solution used in Example 1 was applied by screen printing in the same manner as in Example 1 on a polyimide film (trade name: ECRIOS (registered trademark), VICT-Cz, manufactured by Mitsui Chemicals, Inc.) which features described below is fixed to a flat support with Gaussian curvature of 0 cm$^{-2}$ made of alkaline glass. Then the laminate was heated at 150° C. for 30 minutes to evaporate the water and alcohol solvents, thereby forming a first electrode having a thickness of 1.8 μm in a circular shape with 1 cm diameter (area of 0.79 cm$^2$). The above polyimide film has a glass transition temperature of 305° C., a tensile strength of 220 MPa, an elongation rate of 7%, a total light transmittance of 88%, and the total value of the surface free energy of 43.8 mJ/m$^2$ determined from the same procedure described in Example 1 (the polar component in the total surface free energy is 4.7 mJ/m$^2$).

On the first electrode, 12 wt % of N-methyl-2-pyrrolidone solution of P(VDF-TrFE) with a molar ratio of vinylidene fluoride/trifluoroethylene of 75:25 was applied in the same manner as described in Example 1, and heated at 135° C. for 2 hours to form a ferroelectric layer with thickness of 3 to 5 μm.

The same conductive polymer material solution as the first electrode was applied by screen printing on the ferroelectric layer, and heated at 125° C. for one hour to form a second electrode having a thickness of 2.0 μm in a circular shape with 1 cm diameter (area of 0.79 cm$^2$). The second electrode is superposed with the first electrode toward the thickness direction with the ferroelectric layer therebetween.

The PE loop was obtained by applying an electric field to the ferroelectric layer through the first electrode and the second electrode, and the remnant polarization of the ferroelectric layer was evaluated. The obtained defective rate of the tactile sensors was 0%, that is, the non-defective rate was 100%.

The laminate obtained by the above processes was used as a tactile sensor. The tactile sensor was connected to a circuit consisting of an operational amplifier, a comparator, toggle flip-flop made from a delay flip-flop and red LED light as illustrated in FIG. 6, and it was observed that turning on (lit: on state) and off (unlit: off state) of the LED light was switched by touching the sensor with a finger.

Example 5

The conductive polymer material solution used in Example 1 was applied by screen printing in the same manner as in Example 1 on a polyimide film (trade name: ECRIOS (registered trademark), VICT-Bnp, manufactured by Mitsui Chemicals, Inc.) which features described below is fixed to a flat support with Gaussian curvature of 0 cm$^{-2}$ made of alkaline glass. Then the laminate was heated at 150° C. for 30 minutes to evaporate the water and alcohol solvents, thereby forming a first electrode having a thickness of 2.5 μm in a circular shape with 1 cm diameter (area of 0.79 cm$^2$). The polyimide film has a glass transition temperature of 265° C., a tensile strength of 130 MPa, an elongation rate of 18%, a total light transmittance of 90%, and the total value of the surface free energy of 44.0 mJ/m$^2$ determined from the same procedure described in Example 1 (the polar component in the total surface free energy is 5.2 mJ/m$^2$).

On the first electrode, 12 wt % of N-methyl-2-pyrrolidone solution of P(VDF-TrFE) with a molar ratio of vinylidene fluoride/trifluoroethylene of 75:25 was applied in the same manner as described in Example 1, and heated at 135° C. for 2 hours to form a ferroelectric layer with thickness of 3 to 5 μm.

The same conductive polymer material solution as the first electrode was applied by the screen printing on the ferroelectric layer, and heated at 125° C. for one hour to form a second electrode having a thickness of 2.0 μm in a circular shape with 1 cm diameter (area of 0.79 cm²). The second electrode is superposed with the first electrode toward the thickness direction with the ferroelectric layer therebetween.

The PE loop was obtained by applying an electric field to the ferroelectric layer through the first electrode and the second electrode, and the remnant polarization of the ferroelectric layer was evaluated. The obtained defective rate of the tactile sensors was 0%, that is, the non-defective rate was 100%.

The laminate obtained by the above processes was used as a tactile sensor. The tactile sensor was connected to a circuit consisting of an operational amplifier, a comparator, toggle flip-flop made from a delay flip-flop and red LED light as illustrated in FIG. 6, and it was observed that turning on (lit: on state) and off (unlit: off state) of the LED light was switched by touching the sensor with a finger.

Example 6

A first electrode in a square shape whose side is 3.8 cm (area of 14 cm²) was formed on the polyimide film with Gaussian curvature 0 cm⁻² used in the Example 1 in the same manner as described in Example 1. The first electrode had an average thickness of 2.1 μm.

On the first electrode, 12 wt % of N-methyl-2-pyrrolidone solution of P(VDF-TrFE) with a molar ratio of vinylidene fluoride/trifluoroethylene of 75:25 was applied in the same manner as described in Example 1, and heated at 135° C. for 2 hours to form a ferroelectric layer with a thickness of 3 to 5 μm.

The same conductive polymer material solution in water and alcohol solvents as the first electrode was applied by the screen printing on the ferroelectric layer, and heated at 125° C. for one hour to form a second electrode having a thickness of 2.1 μm in a square shape whose side is 3.8 cm (area of 14 cm²). The second electrode is superposed with the first electrode toward the thickness direction with the ferroelectric layer therebetween.

The PE loop was obtained by applying an electric field to the ferroelectric layer through the first electrode and the second electrode, and the remnant polarization of the ferroelectric layer was evaluated. The obtained defective rate of the tactile sensors was 0%, that is, the non-defective rate was 100%.

The laminate obtained by the above processes was used as a tactile sensor. The tactile sensor was connected to a circuit consisting of an operational amplifier, a comparator, toggle flip-flop made from a delay flip-flop and red LED light as illustrated in FIG. 6, and it was observed that turning on (lit: on state) and off (unlit: off state) of the LED light was switched by touching the sensor with a finger.

Example 7

An oscillator of FA-130RA (rated voltage: 1.5V), manufactured by MABUCHI MOTOR CO., LTD, was connected in parallel to the LED terminal part of the switching devices prepared in Examples 2 to 6. It was confirmed that when the tactile sensor is touched with a finger, the red LED was turned on and the oscillator is driven at the same time, and when the tactile sensor is touched again with a finger, the LED was turned off and the oscillator stops at the same time. The switching device was confirmed to be a device with the function of driving another device.

Comparative Example 1

The conductive polymer material solution in water and alcohol solvents used in Example 1 was applied by screen printing on a PEN film (trade name: Teonex (registered trademark), manufactured by Teijin Film Solutions Limited) which features described below is fixed to a flat support with Gaussian curvature of 0 cm⁻² made of alkaline glass. Then the laminate was heated to evaporate the water and alcohol solvents, thereby forming a first electrode having a thickness of 2.0 μm in a circular shape with 1 cm diameter (area of 0.79 cm²). The PEN film has a glass transition temperature of 118° C., a tensile strength of 110 MPa, an elongation rate of 65%, a total light transmittance of 87%, and the total value of the surface free energy of 40.5 mJ/m² determined from the same procedure described in Example 1 (the polar component in the total surface free energy is 0.92 mJ/m²).

On the first electrode, 12 wt % of N-methyl-2-pyrrolidone solution of P(VDF-TrFE) with a molar ratio of vinylidene fluoride/trifluoroethylene of 75:25 was applied in the same manner as described in Example 1, and heated at 135° C. for 2 hours to form a ferroelectric layer with a thickness of 3 to 5 μm.

The same conductive polymer material solution in water and alcohol solvents as the first electrode was applied by the screen printing on the ferroelectric layer, and heated at 125° C. for one hour to form a second electrode having a thickness of 2.0 μm in a circular shape with 1 cm diameter (area of 0.79 cm²). The second electrode is superposed with the first electrode toward the thickness direction with the ferroelectric layer therebetween.

The PE loop was obtained by applying an electric field to the ferroelectric layer through the first electrode and the second electrode, and the remnant polarization of the ferroelectric layer was evaluated. The obtained defective rate of the tactile sensors was 50%, that is, the non-defective rate was 50%.

When an operational amplifier, a comparator, toggle flip-flop made from a delay flip-flop and red LED light as illustrated in FIG. 6 were connected to a tactile sensor which is a non-defective product, it was observed that turning on (lit: on state) and off (unlit: off state) of the LED light was switched by touching the sensor with a finger. However, when the circuit was connected to a defective product, the red LED wasn't lit.

Comparative Example 2

The conductive polymer material solution in water and alcohol solvents used in Example 1 was applied by screen printing on a brown polyimide film (trade name: Kapton (registered trademark), manufactured by DU PONT-TORAY CO., LTD.) which features described below is fixed to a flat support with Gaussian curvature of 0 cm⁻² made of alkaline glass. Then the laminate was heated to evaporate the water and alcohol solvents, thereby forming a first electrode having a thickness of 2.1 μm in a circular shape with 1 cm diameter (area of 0.79 cm²). The polyimide film has a glass transition temperature of 410° C., a tensile strength of 330 MPa, an elongation rate of 80%, a total light transmittance of 50% or less, and the total value of the surface free energy of 57.1 mJ/m² determined from the same procedure described in Example 1 (the polar component in the total surface free energy is 36 mJ/m²).

On the first electrode, 12 wt % of N-methyl-2-pyrrolidone solution of P(VDF-TrFE) with a molar ratio of vinylidene fluoride/trifluoroethylene of 75:25 was applied in the same manner as described in Example 1, and heated at 135° C. for 2 hours to form a ferroelectric layer with a thickness of 3 to 5 μm.

The same conductive polymer material solution as the first electrode was applied by the screen printing on the ferroelectric layer, and heated at 125° C. for one hour to form a second electrode having a thickness of 2.0 μm in a circular shape with 1 cm diameter (area of 0.79 cm$^2$). The second electrode is superposed with the first electrode toward the thickness direction with the ferroelectric layer therebetween.

The PE loop was obtained by applying an electric field to the ferroelectric layer through the first electrode and the second electrode, and the remnant polarization of the ferroelectric layer was evaluated. The obtained defective rate of the tactile sensors was 67%, that is, the non-defective rate was 33%.

Comparative Example 3

The conductive polymer material solution used in Example 1 was applied by screen printing on a brown (total light transmittance of 50% or less) polyimide film (trade name: Upilex (registered trademark), manufactured by Ube Industries, Ltd.) which features described below is fixed to a flat support with Gaussian curvature of 0 cm$^{-2}$ made of alkaline glass. Then the laminate was heated to evaporate the water and alcohol solvents, thereby forming a first electrode having a thickness of 1.8 μm in a circular shape with 1 cm diameter (area of 0.79 cm$^2$). The polyimide film has a glass transition temperature of 355° C., a tensile strength of 360 MPa, an elongation rate of 50%, a total light transmittance of 50% or less, and the total value of the surface free energy of 44.6 mJ/m$^2$ determined from the same procedure described in Example 1 (the polar component in the total surface free energy is 15.6 mJ/m$^2$).

On the first electrode, 12 wt % of N-methyl-2-pyrrolidone solution of P(VDF-TrFE) with a molar ratio of vinylidene fluoride/trifluoroethylene of 75:25 was applied in the same manner as described in Example 1, and heated at 135° C. for 2 hours to form a ferroelectric layer with a thickness of 3 to 5 μm.

The same conductive polymer material solution as the first electrode was applied by the screen printing on the ferroelectric layer, and heated at 125° C. for one hour to form a second electrode having a thickness of 2.0 μm in a circular shape with 1 cm diameter (area of 0.79 cm$^2$). The second electrode is superposed with the first electrode toward the thickness direction with the ferroelectric layer therebetween.

The PE loop was obtained by applying an electric field to the ferroelectric layer through the first electrode and the second electrode, and the remnant polarization of the ferroelectric layer was evaluated. The obtained defective rate of the tactile sensors was 89%, that is, the non-defective rate was 11%.

Comparative Example 4

The conductive polymer material solution used in Example 1 was applied by screen printing on a PET film (trade name: Lumirror (registered trademark), manufactured by Toray Industries, Inc.) which features described below is fixed to a flat support with Gaussian curvature of 0 cm$^{-2}$ made of alkaline glass. After the laminate was heated at 150° C. for 30 minutes to form a first electrode having a thickness of 1.8 μm in a circular shape with 1 cm diameter (area of 0.79 cm$^2$), shrinkage occurred and wrinkles were generated on the film, thus a smooth electrode could not be produced. The PET film has a glass transition temperature of 75° C., a tensile strength of 215 MPa, an elongation rate of 170%, a total light transmittance of 85%, and the total value of the surface free energy of 44.0 mJ/m$^2$ determined from the same procedure described in Example 1 (the polar component in the total surface free energy is 2.0 mJ/m$^2$).

Comparative Example 5

The conductive polymer material solution used in Example 1 was applied by screen printing on the PET film used in Comprehensive Example 4, and heated at 100° C. for 5 hours to form a first electrode having a thickness of 2.0 μm in a circular shape with 1 cm diameter (area of 0.79 cm$^2$).

On the first electrode, 12 wt % N-methyl-2-pyrrolidone solution of P(VDF-TrFE) used in Example 1 was applied smoothly by using a blade coater in the same manner as in Example 1. When the laminate was fired at 135° C. for 2 hours, shrinkage occurred and wrinkles were generated as in Comparative Example 4, thus a smooth ferroelectric layer could not be formed, and the process could not proceed to the next step Comparative Example 6

The tactile sensor prepared in Example 1 was connected to a circuit consisting of an operational amplifier and toggle flip-flop made from a delay flip-flop and red LED light as illustrated in FIG. 8. Touching the tactile sensor with a finger turned the state of the voltage on, but releasing the finger switched the voltage to the off state (the on state does not continue as shown in FIG. 9), and as a result, the LED did not keep lit but was turned off.

Example 8

A polyamic acid varnish for forming the polyimide thin film of Example 4 (trade name: ECRIOS (registered trademark), VICT-Cz, manufactured by Mitsui Chemicals, Inc.) was applied by soft blanket gravure offset printing on a three-dimensional support with a convex spherical surface made of borosilicate glass with a radius of curvature of 10 cm (Gaussian curvature of 0.01 cm$^{-2}$). The varnish on the support was heated at 320° C. for 2 hours under inert gas for dehydration and cyclization reaction to form a polyimide thin film.

On the formed polyimide thin film, the stretchable conductive paste, XA-9521 (manufactured by Fujikura Kasei Co., Ltd.), whose main component is silver, was printed as a first electrode by a soft blanket gravure offset printing machine to have width of 0.5 cm and length of 6 cm (an area of 3.0 cm$^2$). Specifically, a brown polyimide film having a slit with 77 μm-depth was placed on a glass board fixed to a stainless steel table by a vacuum pump, and the slit is filled with XA-9521 by using a doctor blade. After the brown polyimide film was removed from the glass board, the paste was received onto a PDMS soft blanket by rotational crimping. The received paste was transferred by rotational crimping onto the polyimide thin film on the spherical surface made of borosilicate glass formed thereon, which was suction-fixed to another stainless steel table, at a moving speed of 30 mm/sec, thereby printing the electrode. The obtained laminate was heated at 150° C. for 1 hour to prepare the first electrode. The electrode had thickness of 5.4 μm, and volume resistivity of 4.5×10$^{-4}$ Ω·cm.

On the first electrode, 12 wt % of N-methyl-2-pyrrolidone solution of Piezotech FC25 (manufactured by Arkema), which is P(VDF-TrFE) with a molar ratio of vinylidene fluoride/trifluoroethylene of 75:25, was dropped and applied by using a syringe. The N-methyl-2-pyrrolidone was evaporated by heat at 135° C. for 2 hours under inert gas, thereby forming a ferroelectric layer with a thickness of 3 to 5 It was confirmed that the Curie temperature of Piezotech FC25 measured by a DSC was 130° C.

Then, the stretchable conductive paste, XA-9521 (manufactured by Fujikura Kasei Co., Ltd.), whose main component is silver, was printed as a second electrode on the ferroelectric layer by the soft blanket gravure offset printing machine to have a width of 0.5 cm and a length of 6 cm (an area of 3.0 cm²). The second electrode was printed toward the direction crossing the first electrode with the ferroelectric layer therebetween. The laminate was heated at 120° C., which is a temperature lower than the Curie temperature, for 2 hours to prepare the second electrode.

The PE loop was obtained by applying an electric field to the ferroelectric layer through the first electrode and the second electrode, and the remnant polarization of the ferroelectric layer was evaluated and found to be 7.0 μC/cm².

Example 9

Figure 5:
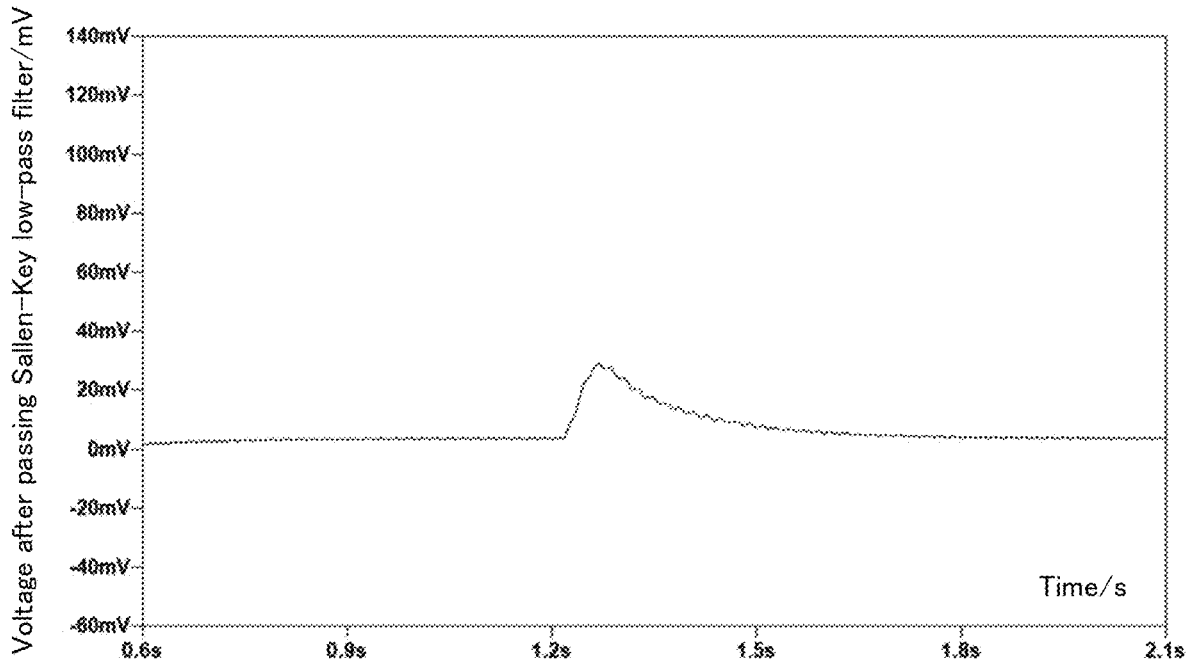
FIG. 5 shows voltage signals in which the noise shown in FIG. 2 is suppressed by the circuit of FIG. 4.

The laminate obtained in Example 8 was used as a tactile sensor. The sensor was connected to an oscilloscope utilizing the first electrode as the ground electrode, and when a finger touched the second electrode, the generation of a voltage signal was observed by the oscilloscope. Noise from a 50 Hz commercial power supply was also observed with this voltage signal, but when the second electrode was connected to a Sallen-Key low-pass filter shown in the circuit diagram of FIG. 4, the noise was attenuated. As shown in FIG. 5, it was confirmed that the voltage signal was selectively extracted by touching with a finger.

The tactile sensor prepared in this way was peeled off from the spherical surface made of borosilicate glass and attached with an adhesive to a white spherical surface made of polypropylene with the same Gaussian curvature of 0.01 cm⁻². The obtained tactile sensor suited to the spherical surface without wrinkles or other appearance defects. Also, no damage to the sensor occurred by peeling off, and it was confirmed that a voltage signal was generated by touching with a finger.

Example 10

A polyimide thin film was formed on a three-dimensional support with a convex spherical surface made of borosilicate glass with a radius of curvature of 10 cm (Gaussian curvature of 0.01 cm⁻²) in the same manner as in Example 8. On the polyimide thin film, the stretchable conductive paste, XA-9521 (manufactured by Fujikura Kasei Co., Ltd.), whose main component is silver, was printed as a first electrode by the soft blanket gravure offset printing method to have a width of 0.5 cm and a length of 6 cm (an area of 3.0 cm²) in the same manner as in Example 8. The laminate was heated at 150° C. for 1 hour to prepare a first electrode having thickness of 6.0 μm and volume resistivity of $5.0 \times 10^{-5}$ Ω·cm.

On the first electrode, 12 wt % of N-methyl-2-pyrrolidone solution of Piezotech FC25 (manufactured by Arkema), which is P(VDF-TrFE) with a molar ratio of vinylidene fluoride/trifluoroethylene of 75:25, was dropped and applied by using a syringe. The N-methyl-2-pyrrolidone was evaporated by heating at 135° C. for 2 hours, thereby forming a ferroelectric layer with a thickness of 3 to 5 μm.

Then, the silver paste XA-3609 (manufactured by Fujikura Kasei Co., Ltd.) was printed as a second electrode on the ferroelectric layer by the soft blanket gravure offset printing machine to have a width of 0.5 cm and a length of 6 cm (an area of 3.0 cm²). The second electrode was printed toward the direction crossing the first electrode with the ferroelectric layer therebetween. The laminate was heated at 120° C., which is a temperature lower than the Curie temperature, for 2 hours to prepare the second electrode.

The PE loop was obtained by applying an electric field to the ferroelectric layer through the first electrode and the second electrode, and the remnant polarization of the ferroelectric layer was evaluated and found to be 7.0 μC/cm².

Example 11

The laminate obtained in Example 10 was used as a tactile sensor. The sensor was connected to an oscilloscope utilizing the first electrode as the ground electrode, and when a finger touched the second electrode, generation of a voltage signal was observed by the oscilloscope. Noise from a 50 Hz commercial power supply was also observed with this voltage signal, but when the second electrode was connected to a Sallen-Key low-pass filter shown in the circuit diagram of FIG. 4, the noise was attenuated. As a result, it was confirmed that the voltage signal was selectively extracted by touching with a finger.

Example 12

A polyamic acid varnish for forming the polyimide thin film of Example 4 (trade name: ECRIOS (registered trademark), VICT-Cz, manufactured by Mitsui Chemicals, Inc.) was applied by soft blanket gravure offset printing on a three-dimensional support with a convex spherical surface made of borosilicate glass with a radius of curvature of 5 cm (Gaussian curvature of 0.04 cm⁻²). The varnish on the support was heated at 320° C. for 2 hours under inert gas for dehydration and cyclization reaction to form a polyimide thin film.

On the formed polyimide thin film, the stretchable conductive paste, XA-9521 (manufactured by Fujikura Kasei Co., Ltd.), whose main component is silver, was printed as a first electrode by a soft blanket gravure offset printing machine to have width of 0.5 cm and length of 6 cm (an area of 3.0 cm²). Specifically, a brown polyimide film having a slit with 77 μm-depth was placed on a glass board fixed to a stainless steel table by a vacuum pump, and the slit is filled with silver paste XA-9521 by using a doctor blade. After the brown polyimide film was removed from the glass board, the paste was received onto a PDMS soft blanket by rotational crimping. The received paste was transferred by rotational crimping onto the polyimide thin film on the spherical surface made of borosilicate glass, which was suction-fixed to another stainless steel table, at a moving speed of 30 mm/sec, thereby printing the electrode. The obtained laminate was heated at 150° C. for 1 hour to prepare the first electrode. The electrode had thickness of 5.4 μm, and volume resistivity of $4.5 \times 10^{-4}$ Ω·cm.

On the first electrode, 12 wt % of N-methyl-2-pyrrolidone solution of Piezotech FC25 (manufactured by Arkema), which is P(VDF-TrFE) with a molar ratio of vinylidene fluoride/trifluoroethylene of 75:25, was dropped and applied by using a syringe. The N-methyl-2-pyrrolidone was evaporated by heating at 135° C. for 2 hours, thereby forming a ferroelectric layer with a thickness of 3 to 5 μm.

Then, the stretchable conductive paste, XA-9521 (manufactured by Fujikura Kasei Co., Ltd.), whose main component is silver, was printed as a second electrode on the ferroelectric layer by the soft blanket gravure offset printing machine to have width of 0.5 cm and length of 6 cm (an area of 3.0 cm$^2$). The second electrode was printed toward the direction crossing the first electrode with the ferroelectric layer therebetween. The laminate was heated at 120° C., which is a temperature lower than the Curie temperature, for 2 hours to prepare the second electrode.

The PE loop was obtained by applying an electric field to the ferroelectric layer through the first electrode and the second electrode, and the remnant polarization of the ferroelectric layer was evaluated and found to be 7.0 µC/cm$^2$.

Example 13

The laminate obtained in Example 12 was used as a tactile sensor. The sensor was connected to an oscilloscope utilizing the first electrode as the ground electrode, and when a finger touched the second electrode, generation of a voltage signal was observed by the oscilloscope. Noise from a 50 Hz commercial power supply was also observed with this voltage signal, but when the second electrode was connected to a Sallen-Key low-pass filter shown in the circuit diagram of FIG. 4, the noise was attenuated. As a result, it was confirmed that the voltage signal was selectively extracted by touching with a finger.

The tactile sensor prepared in this way was peeled off from the spherical surface made of borosilicate glass and attached with an instant adhesive to a white spherical surface made of polypropylene with the same Gaussian curvature of 0.04 cm$^{-2}$ as that of the spherical surface made of borosilicate glass. The obtained tactile sensor suited to the spherical surface without wrinkles or other appearance defects. Also, no damage to the sensor occurred by peeling off, and it was confirmed that a voltage signal was generated by touching with a finger.

Example 14

A polyimide thin film was formed on a three-dimensional support with a convex spherical surface made of borosilicate glass with a radius of curvature of 10 cm (Gaussian curvature of 0.01 cm$^{-2}$) in the same manner as in Example 8. On the polyimide thin film, silver particle ink NPS-L (manufactured by Harima Chemicals Group, Inc.) was printed as a first electrode by inkjet printer capable of printing on three-dimensional objects to have width of 0.5 cm and length of 6 cm (an area of 3.0 cm$^2$). The laminate was heated at 150° C. for 1 hour to prepare a first electrode. The electrode had thickness of 0.50 µm, and volume resistivity of 1.0×10$^{-5}$ Ω·cm.

On the first electrode, 12 wt % of N-methyl-2-pyrrolidone solution of Piezotech FC25 (manufactured by Arkema), which is P(VDF-TrFE) with a molar ratio of vinylidene fluoride/trifluoroethylene of 75:25, was dropped and applied by using a syringe. The N-methyl-2-pyrrolidone was evaporated by heating at 135° C. for 2 hours gas, thereby forming a ferroelectric layer with thickness of 3 to 5 µm.

Then, the silver particle ink NPS-L (manufactured by Harima Chemicals Group, Inc.) was printed as a second electrode on the ferroelectric layer by inkjet printer capable of printing on three-dimensional objects to have width of 0.5 cm and length of 6 cm (an area of 3.0 cm$^2$). The laminate was heated at 120° C., which is a temperature lower than the Curie temperature, for 2 hours to prepare the second electrode.

The PE loop was obtained by applying an electric field to the ferroelectric layer through the first electrode and the second electrode, and the remnant polarization of the ferroelectric layer was evaluated and found to be 7.0 µC/cm$^2$.

Example 15

The laminate obtained in Example 14 was used as a tactile sensor. The sensor was connected to an oscilloscope utilizing the first electrode as the ground electrode, and when a finger touched the second electrode, generation of a voltage signal was observed by the oscilloscope. Noise from a 50 Hz commercial power supply was also observed with this voltage signal, but when the second electrode was connected to a Sallen-Key low-pass filter shown in the circuit diagram of FIG. 4, the noise was attenuated. As a result, it was confirmed that the voltage signal was selectively extracted by touching with a finger.

Example 16

A polyimide thin film was formed on a three-dimensional support with a convex spherical surface made of borosilicate glass with a radius of curvature of 10 cm (Gaussian curvature of 0.01 cm$^{-2}$) in the same manner as in Example 8. On the formed polyimide thin film, a PEDOT/PSS solution in ethanol was printed as a first electrode by using a dispenser capable of printing on three-dimensional objects to have width of 0.5 cm and length of 6 cm (an area of 3.0 cm$^2$). The laminate was heated at 150° C. for 1 hour to prepare a first electrode. The electrode had thickness of 10 and volume resistivity of 4.0 Ω·cm.

On the first electrode, 12 wt % of N-methyl-2-pyrrolidone solution of Piezotech FC25 (manufactured by Arkema), which is P(VDF-TrFE) with a molar ratio of vinylidene fluoride/trifluoroethylene of 75:25, was dropped and applied by using a syringe. The N-methyl-2-pyrrolidone was evaporated by heating at 135° C. for 2 hours, thereby forming a ferroelectric layer with a thickness of 3 to 5 µm.

Then, the PEDOT/PSS solution in ethanol was printed as a second electrode on the ferroelectric layer by using the dispenser capable of printing on three-dimensional objects to have width of 0.5 cm and length of 6 cm (an area of 3.0 cm$^2$). The laminate was heated at 120° C., which is a temperature lower than the Curie temperature, for 2 hours to prepare the second electrode.

The PE loop was obtained by applying an electric field to the ferroelectric layer through the first electrode and the second electrode, and the remnant polarization of the ferroelectric layer was evaluated and found to be 7.0 µC/cm$^2$.

Example 17

The laminate obtained in Example 9 was used as a tactile sensor. The sensor was connected to an oscilloscope utilizing the first electrode as the ground electrode, and when a finger touched the second electrode, generation of a voltage signal was observed by the oscilloscope. Noise from a 50 Hz commercial power supply was also observed with this voltage signal, but when the second electrode was connected to a Sallen-Key low-pass filter shown in the circuit diagram of FIG. 4, the noise was attenuated. As a result, it was confirmed that the voltage signal was selectively extracted by touching with a finger.

Example 18

A polyimide thin film was formed on a three-dimensional support with a convex spherical surface made of borosilicate glass with a radius of curvature of 10 cm (Gaussian curvature of 0.01 cm$^{-2}$) in the same manner as in Example 8. On the polyimide thin film, the stretchable conductive paste, XA-9521 (manufactured by Fujikura Kasei Co., Ltd.), whose main component is silver, was printed as a first electrode by the soft blanket gravure offset printing method to have width of 0.5 cm and length of 6 cm (an area of 3.0 cm$^2$) in the same manner as in Example 8. The laminate was heated at 150° C. for 1 hour to prepare a first electrode. The electrode had thickness of 5.4 μm and volume resistivity of 4.5×10$^{-4}$ Ω·cm.

On the first electrode, 12 wt % of N-methyl-2-pyrrolidone solution of Piezotech FC30 (manufactured by Arkema), which is P(VDF-TrFE) with a molar ratio of vinylidene fluoride/trifluoroethylene of 70:30, was dropped and applied by using a syringe. The N-methyl-2-pyrrolidone was evaporated by heating at 135° C. for 2 hours, thereby forming a ferroelectric layer with thickness of 3 to 5 μm. It was confirmed that the Curie temperature of Piezotech FC30 measured by a DSC was 100° C.

Then, the stretchable conductive paste XA-9521 was printed as a second electrode on the ferroelectric layer by the soft blanket gravure offset printing method to have width of 0.5 cm and length of 6 cm (an area of 3.0 cm$^2$). The second electrode was printed toward the direction crossing the first electrode with the ferroelectric layer therebetween. The laminate was heated at 90° C., which is a temperature lower than the Curie temperature, for 1 hour to prepare the second electrode.

The PE loop was obtained by applying an electric field to the ferroelectric layer through the first electrode and the second electrode, and the remnant polarization of the ferroelectric layer was evaluated and found to be 6.5 μC/cm$^2$.

Example 19

The laminate obtained by the above process was used as a tactile sensor. The sensor was connected to an oscilloscope utilizing the first electrode as the ground electrode, and when a finger touched the second electrode, generation of a voltage signal was observed by the oscilloscope. Noise from a 50 Hz commercial power supply was also observed with this voltage signal, but when the second electrode was connected to a Sallen-Key low-pass filter shown in the circuit diagram of FIG. 4, the noise was attenuated. As a result, it was confirmed that the voltage signal was selectively extracted by touching with a finger.

Example 20

A polyimide thin film was formed on a three-dimensional support with a convex spherical surface made of borosilicate glass with a radius of curvature of 10 cm (Gaussian curvature of 0.01 cm$^{-2}$) in the same manner as in Example 8. On the polyimide thin film, the stretchable conductive paste, XA-9521 (manufactured by Fujikura Kasei Co., Ltd.), whose main component is silver, was printed as a first electrode by the soft blanket gravure offset printing method to have width of 0.5 cm and length of 6 cm (an area of 3.0 cm$^2$) in the same manner as in Example 8. The laminate was heated at 150° C. for 1 hour to prepare a first electrode. The electrode had thickness of 5.4 μm and volume resistivity of 4.5×10$^{-4}$ Ω·cm.

On the first electrode, 12 wt % of N-methyl-2-pyrrolidone solution of Piezotech FC20 (manufactured by Arkema), which is P(VDF-TrFE) with a molar ratio of vinylidene fluoride/trifluoroethylene of 80:20, was dropped and applied by using a syringe. The N-methyl-2-pyrrolidone was evaporated by heat at 145° C. for 2 hours, thereby forming a ferroelectric layer with a thickness of 3 to 5 μm. It was confirmed that the Curie temperature of Piezotech FC20 measured by a DSC was 140° C.

Then, the stretchable conductive paste XA-9521 was printed as a second electrode on the ferroelectric layer by the soft blanket gravure offset printing method to have width of 0.5 cm and length of 6 cm (an area of 3.0 cm$^2$). The second electrode was printed toward the direction crossing the first electrode with the ferroelectric layer therebetween. The laminate was heated at 135° C., which is a temperature lower than the Curie temperature, for 30 minutes to prepare the second electrode.

The PE loop was obtained by applying an electric field to the ferroelectric layer through the first electrode and the second electrode, and the remnant polarization of the ferroelectric layer was evaluated and found to be 8.0 μC/cm$^2$.

Example 21

The laminate obtained in Example 13 was used as a tactile sensor. The sensor was connected to an oscilloscope utilizing the first electrode as the ground electrode, and when a finger touched the second electrode, generation of a voltage signal was observed by the oscilloscope. Noise from a 50 Hz commercial power supply was also observed with this voltage signal, but when the second electrode was connected to a Sallen-Key low-pass filter shown in the circuit diagram of FIG. 4, the noise was attenuated. As a result, it was confirmed that the voltage signal was selectively extracted by touching with a finger.

The tactile sensor prepared in this way was peeled off from the spherical surface made of borosilicate glass and attached with an instant adhesive to a white spherical surface made of polypropylene with the same Gaussian curvature of 0.01 cm$^{-2}$ as that of the spherical surface made of borosilicate glass. The obtained tactile sensor suited to the spherical surface without wrinkles or other appearance defects. Also, no damage to the sensor occurred by peeling off, and it was confirmed that a voltage signal was generated by touching with a finger.

Comparative Example 7

A polyamic acid varnish (trade name: UPIA (registered trademark) AT, manufactured by Ube Industries, Ltd.) for forming the brown polyimide thin film was applied by soft blanket gravure offset printing on a three-dimensional support with a convex spherical surface made of borosilicate glass with a radius of curvature of 10 cm (Gaussian curvature of 0.01 cm$^{-2}$). The varnish on the support was heated at 340° C. for 2 hours under inert gas for dehydration and cyclization reaction to form a brown polyimide thin film. The total light transmittance of the polyimide thin film was 40% and it had no transparency.

On the formed polyimide thin film, the stretchable conductive paste, XA-9521 (manufactured by Fujikura Kasei Co., Ltd.), whose main component is silver, was printed as a first electrode by a soft blanket gravure offset printing machine to have width of 0.5 cm and length of 6 cm (an area of 3.0 cm$^2$). Specifically, a brown polyimide film having a slit with 77 μm-depth was placed on a glass board fixed to a stainless steel table by a vacuum pump, and the slit is filled with XA-9521 by using a doctor blade. After the brown polyimide film was removed from the glass board, the paste was received onto a PDMS soft blanket by rotational crimping. The received paste was transferred by rotational crimping onto the polyimide thin film on the spherical surface made of borosilicate glass formed thereon, which was suction-fixed to another stainless steel table, at a moving speed of 30 mm/sec, thereby printing the electrode.

The laminate was heated at 150° C. for 1 hour to prepare a first electrode. The electrode had thickness of 5.4 μm, and volume resistivity of $4.5 \times 10^{-4}$ Ω·cm.

On the first electrode, 12 wt % of N-methyl-2-pyrrolidone solution of Piezotech FC25 (manufactured by Arkema), which is P(VDF-TrFE) with a molar ratio of vinylidene fluoride/trifluoroethylene of 75:25, was dropped and applied by using a syringe. The N-methyl-2-pyrrolidone was evaporated by heating at 135° C. for 2 hours, thereby forming a ferroelectric layer with a thickness of 3 to 5 μm.

Then, the stretchable conductive paste XA-9521 was printed as a second electrode on the ferroelectric layer by the soft blanket gravure offset printing method to have width of 0.5 cm and length of 6 cm (an area of 3.0 cm$^2$). The second electrode was printed toward the direction crossing the first electrode with the ferroelectric layer therebetween. The laminate was heated at 120° C., which is a temperature lower than the Curie temperature, for 2 hours to prepare the second electrode.

The PE loop was obtained by applying an electric field to the ferroelectric layer through the first electrode and the second electrode, and the remnant polarization of the ferroelectric layer was evaluated and found to be 7.0 μC/cm$^2$.

The laminate prepared in this way (as a tactile sensor) was peeled off from the spherical surface made of quartz glass and attached with an instant adhesive to a white spherical surface made of polypropylene with the same Gaussian curvature of 0.01 cm$^{-1}$ as that of the spherical surface made of quartz glass. This brown polyimide thin film was stiff, had low flexibility, and caused wiring damage due to repeated bending.

Comparative Example 8

A polyamic acid varnish (trade name: ECRIOS (registered trademark), VICT-Cz, manufactured by Mitsui Chemicals, Inc.) for forming the polyimide thin film of Example 4 was applied on a three-dimensional support, i.e., a convex spherical surface made of borosilicate glass with a radius of curvature of 4.5 cm (Gaussian curvature of 0.050 cm$^{-1}$) by soft blanket gravure offset printing, and heated at 320° C. for 2 hours for dehydration and cyclization reaction to form a polyimide thin film. After a first electrode was formed from stretchable conductive paste XA-9521 (manufactured by Fujikura Kasei Co., Ltd.), whose main component is silver, in the same manner as in Example 8, 12 wt % N-methyl-2-pyrrolidone solution of Piezotech FC25 (manufactured by Arkema) was dropped and applied, but a ferroelectric layer could not be formed.

This application claims priority based on Japanese Patent Application No. 2019-113906, filed on Jun. 19, 2019, the entire contents of which including the specification and the drawings are incorporated herein by reference.

INDUSTRIAL APPLICABILITY

Using the tactile sensor of the present invention and an electronic circuit including the tactile sensor and having a switch function can provide a switching device having the switch function controlled by the electronic circuit with the following advantages. The switching device is light, flexible, and tough, so that the switching device is applicable to various three-dimensional shape; the switching device does not stand out in the area where it is disposed due to its transparent substrate; the thickness reduction is possible since a polymer film board can be formed by a solution process. The switching device is both economical and stable with a high non-defective product rate.

The invention claimed is:
1. A tactile sensor, comprising:
a first electrode printed on a surface of a polyimide thin film having a constituent unit represented by a general formula (1) below, the polyimide thin film having a glass transition temperature of 250° C. or higher and 310° C. or lower, a tensile strength of 250 MPa or less, an elongation rate of 30% or less, a total light transmittance of 80% or more, and a polar component of surface free energy in the range of 1.5 to 10 mJ/m$^2$:

General Formula (1)

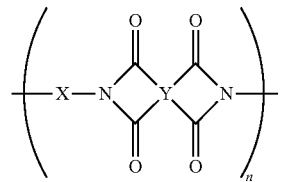

wherein X is at least one member selected from the group consisting of the following alicyclic groups:

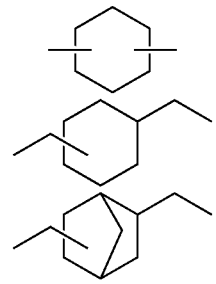

and
wherein Y is at least one member selected from the group consisting of the following aromatic groups:

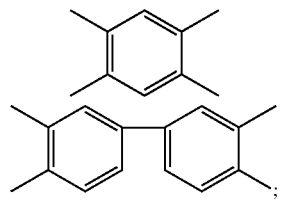

a ferroelectric layer printed so as to cover the first electrode; and
a second electrode printed so as to be superposed with the first electrode with the ferroelectric layer therebetween.

2. The tactile sensor according to claim 1, wherein the polyimide thin film is formed on a surface of a support having Gaussian curvature of 0 cm$^{-2}$.

3. The tactile sensor according to claim 1, wherein the polyimide thin film is formed on a surface of a support having Gaussian curvature of 0.04 cm$^{-2}$ or less in absolute value.

4. The tactile sensor according to claim 1, wherein a non-defective product rate of the tactile sensor is 99.9% or higher.

5. The tactile sensor according to claim 1, wherein:
the X in the general formula (1) is at least one member selected from the group consisting of the following alicyclic groups:

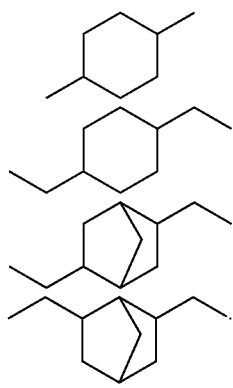

6. The tactile sensor according to claim 1, wherein a main component of each of the first electrode and the second electrode is silver or a polythiophene-based conductive polymer.

7. The tactile sensor according to claim 1, wherein an area of each of the first electrode and the second electrode is in the range of $1.0 \times 10^{-2}$ to 15 cm$^2$.

8. The tactile sensor according to claim 1, wherein the ferroelectric layer contains a copolymer (P(VDF-TrFE)) consisting of vinylidene fluoride (VDF) and trifluoroethylene (TrFE) with a molar ratio in the range of 80/20 to 70/30.

9. The tactile sensor according to claim 1, wherein either the first electrode or the second electrode is used as a ground electrode, and another one is connected to an electronic circuit for controlling noise.

10. The tactile sensor according to claim 1, wherein an electronic circuit for controlling noise is an active-type low-pass filter.

11. The tactile sensor according to claim 1, wherein an electronic circuit for controlling noise is a comparator.

12. A switching device, wherein an electronic circuit for controlling noise is connected to the tactile sensor according to claim 1; and the switching device enhances to drive another device.

13. A switching device, comprising:
the tactile sensor according to claim 1;
an electronic circuit for controlling noise connected to the tactile sensor; and
a toggle-flip-flop circuit connected to the electronic circuit, wherein
an on state and an off state of a voltage are switched by deformation of the ferroelectric layer caused by pressure, and
the switching device enhances to drive another device.

14. The switching device according to claim 12, further comprising a sensuously recognizable unit for the on-state and the off-state of voltage.

* * * * *